(12) United States Patent
Becker et al.

(10) Patent No.: US 8,808,577 B2
(45) Date of Patent: Aug. 19, 2014

(54) THERMALLY STABLE OXYNITRIDE PHOSPHOR AND LIGHT SOURCE COMPRISING SUCH A PHOSPHOR

(75) Inventors: Daniel Becker, Augsburg (DE); Wolfram Hempel, Leutenbach (DE); Frank Jermann, Königsbrunn (DE); Bianca Pohl, München (DE)

(73) Assignee: OSRAM Gesellschaft mit beschrankter Haftung, Munich (DE)

( * ) Notice: Subject to any disclaimer, the term of this patent is extended or adjusted under 35 U.S.C. 154(b) by 809 days.

(21) Appl. No.: 12/671,685

(22) PCT Filed: Jul. 24, 2008

(86) PCT No.: PCT/EP2008/059726
§ 371 (c)(1), (2), (4) Date: Feb. 1, 2010

(87) PCT Pub. No.: WO2009/016096
PCT Pub. Date: Feb. 5, 2009

(65) Prior Publication Data
US 2011/0186778 A1    Aug. 4, 2011

(30) Foreign Application Priority Data
Jul. 30, 2007  (DE) .......................... 10 2007 035 592

(51) Int. Cl.
*C09K 11/77* (2006.01)
*C09K 11/59* (2006.01)
*C09K 11/08* (2006.01)

(52) U.S. Cl.
USPC .............. 252/301.4 F; 252/301.6 F; 313/503; 313/486; 257/98

(58) Field of Classification Search
USPC .............. 252/301.4 F, 301.6 F; 313/503, 486; 257/98
See application file for complete search history.

(56) References Cited

U.S. PATENT DOCUMENTS

| 7,540,977 | B2 * | 6/2009 | Hirosaki et al. ........ 252/301.4 F |
| 7,675,083 | B2 | 3/2010 | Shioi |
| 7,791,265 | B2 * | 9/2010 | Fiedler et al. ................. 313/501 |
| 7,833,436 | B2 * | 11/2010 | Shimooka et al. ...... 252/301.4 F |

FOREIGN PATENT DOCUMENTS

| CN | 101379163 | 3/2009 |
| EP | 1 595 934 | 11/2005 |
| EP | 1 985 683 | 10/2008 |
| JP | 2006 124674 | 5/2006 |

(Continued)

OTHER PUBLICATIONS

Taiwan Search Report dated Jun. 11, 2013.

(Continued)

*Primary Examiner* — Carol M Koslow
(74) *Attorney, Agent, or Firm* — Cozen O'Connor

(57) ABSTRACT

A thermally stable phosphor made of the M-Si—O—N system, having a cation M and an activator D, M being represented by Ba or Sr alone or as a mixture and optionally also being combined with at least one other element from the group Ca, Mg, Zn, Cu. The phosphor is activated with Eu or Ce or Tb alone or as a mixture, optionally in codoping with Mn or Yb. The activator D partially replaces the cation M. The phosphor is produced from the charge stoichiometry $MO—SiO_2—SiN_{4/3}$ with an increased oxygen content relative to the known phosphor $MSi_2O_2N_2$:D, where MO is an oxidic compound.

19 Claims, 20 Drawing Sheets

(56) References Cited

FOREIGN PATENT DOCUMENTS

| | | | |
|---|---|---|---|
| JP | 2006-124674 | * | 5/2006 |
| JP | 2006-124675 | | 5/2006 |
| JP | 2007-223864 | | 9/2007 |
| JP | 2008-138156 | | 6/2008 |
| JP | 2009-024038 | | 2/2009 |
| WO | WO 2006/033418 | * | 3/2006 |
| WO | WO 2006/035991 | * | 4/2006 |
| WO | WO 2006/035991 A | | 4/2006 |
| WO | WO 2007/018260 | | 2/2007 |
| WO | WO 2007/068592 | * | 6/2007 |
| WO | WO 2007/088966 | * | 8/2007 |

OTHER PUBLICATIONS

Yen, William M. et al., "Inorganic Phosphors: Compositions, Preparation and Optical Properties," CRC Press, 2004, p. 10.

Kijima, Naoto et al., "New Green and Red Phosphors for White LEDs," Journal of Light & Visual Environment, vol. 32, No. 2 pp. 202-207 (2008).

* cited by examiner

THERMALLY STABLE OXYNITRIDE PHOSPHOR AND LIGHT SOURCE COMPRISING SUCH A PHOSPHOR

RELATED APPLICATIONS

This is a U.S. national stage of application No. PCT/EP2008/059726, filed on Jul. 24, 2008.

This application claims priority of the German application no. 10 2007 035 592.2 filed Jul. 30, 2007, the entire content of which is hereby incorporated by reference.

FIELD OF THE INVENTION

1. Technical Field

The invention relates to a thermally stable phosphor, preferably for use in light sources. The invention also concerns a high-efficiency phosphor of the SiON class. The invention also concerns a light source produced therewith and to a method for producing such a phosphor.

2. Background of the Invention

EP-A 1 413 618 discloses a phosphor which belongs to the oxynitride class and has the composition $MSi_2O_2N_2$:Z. M is primarily Ca, Ba or Sr, and the activator Z is primarily Eu. They are referred to here as SiONs. This phosphor can be excited well in the UV and blue spectral ranges. It is suitable for light sources such as LEDs.

SUMMARY OF THE INVENTION

It is an object of the present invention to provide a narrow-band thermally stable phosphor, which preferably emits in the green range. The phosphor is intended to be particularly suitable for use with UV and blue LEDs. Other applications, however, are not excluded.

The systems known to date are distinguished in the case of nitrides by very high efficiency and thermal stability. However, no efficient narrowband-emitting systems with a peak wavelength at 525-535 nm are as yet known. Although green orthosilicates and thiogallates emit with a narrow band and are also very efficient at room temperature, they nevertheless have a very poor temperature response. This means that their luminescent efficiency LE decreases very strongly with an increasing temperature (typically, <10% at 225° C.). However, the thermal stability of the luminescence is worse than in the case of nitrides. Furthermore, shorter-wavelength emission is desirable in certain applications, particularly in order to achieve a higher useful visual effect.

For many applications, for example in LCD backlights or for RPTV (rear projection television), very thermally stable phosphors which can be excited in the blue or near UV ranges, with a peak wavelength of between 525 and 535 nm, are required. This wavelength ideally matches the conventional color filters and allows good color rendering. The good thermal stability is necessary since the phosphor can be heated greatly owing to the high chip temperatures at high powers and owing to the heat evolved in the phosphor particle, with high radiation fluxes. This can result in temperatures of up to 200° C.

The cause of the second heating mechanism is the so-called Stokes shift, i.e. the energy difference between absorbed and emitted photons, which is converted into heat in the phosphor.

To date, there is not any known narrowband green phosphor which even at elevated temperatures, preferably at least 125° C., in particular at least 175° C., still has high efficiencies, specifically at least 80%, in particular even at least 90% of the efficiency at room temperature. The term narrow band is intended to mean an FWHM of at most 70 nm. The term green phosphor is intended to mean a phosphor whose peak wavelength lies in the range of from 520 to 540 nm, particularly in a range of from 525 to 535 nm.

An entirely novel phosphor has been discovered in the phase system $BaO$—$SiO_2$—$Si_3N_4$. This phosphor differs from the known $BaSi_2O_2N_2$ by a substantially higher oxygen content, and from the known silicates such as $Ba_2SiO_4$, $BaSi_2O_5$ and $BaSiO_3$ by a significant nitrogen component in the host lattice. The new phase has an XRD reflection pattern which differs from all known silicates and SiONs. It implies a high symmetry of the new compound. The charge stoichiometry can preferably be described in an exemplary embodiment by $Ba_9Si_{21}O_{36}N_{10}$.

The activator D, which replaces Ba, is preferably either Eu alone or together with Yb. The Yb component should not however be more than 10 mol % of D, preferably a component in the range of from 1 to 5%.

The novel phosphor has a much better thermal stability than known green phosphors such as $(Sr,Ba)_2SiO_4$:Eu (orthosilicate) or $SrGa_2(S,Se)_4$:Eu (thiogallate type). While the best orthosilicates available on the market still have about 25-30% of their room temperature efficiency at 175° C., the new compound here has 80-90% and therefore represents a technical breakthrough.

The novel phosphor shows very good thermal and chemical stability. It can be used very well for example for white LEDs, color-on-demand (COD), RPTV/TV backlighting LEDs and electric lamps such as fluorescent lamps.

A production method for the novel phosphor is furthermore provided.

BRIEF DESCRIPTION OF THE DRAWINGS

The invention will be explained in more detail below with the aid of an exemplary embodiment. In the figures.

PREFERRED EMBODIMENT OF THE INVENTION

Figure 1:
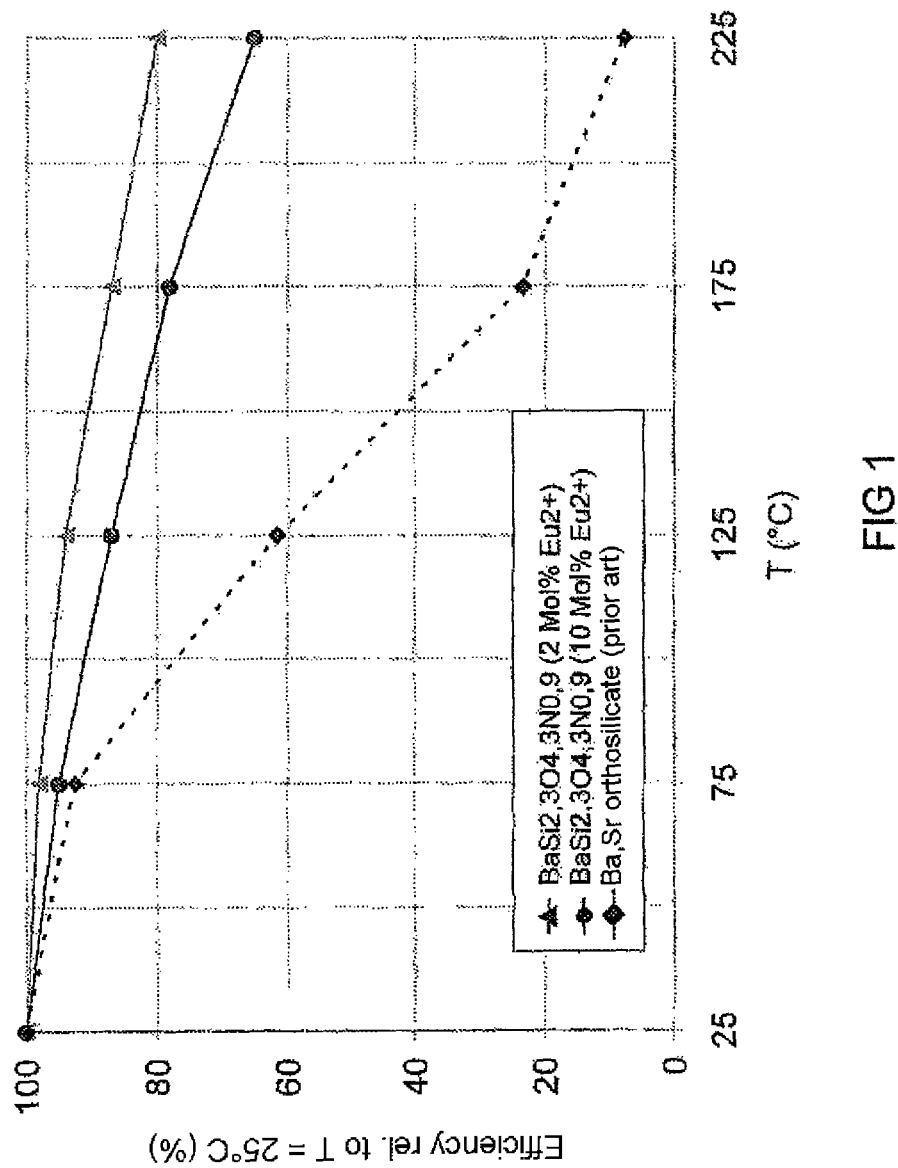
FIG. 1 shows the stability of the efficiency of a novel phosphor in relation to thermal quenching.

FIG. 1 shows the stability of the efficiency in relation to thermal quenching. The newly discovered phosphor phase has an outstanding thermal efficiency of its emission compared with all other known, usually $Eu^{2+}$-activated systems emitting with a narrow band at about 525 to 535 nm. FIG. 1 shows a comparison between the Ba—SiON phase according to the invention and an SrBa orthosilicate with similar emission, which represents the best prior art.

A specific novel phosphor is $BaSi_{2.3}O_{4.3}N_{0.9}$:Eu(2%)=$Ba_2Si_{4.6}O_{8.6}N_{1.8}$:Eu(2%). Its production will be described in more detail below.

The starting substances 11.784 g $BaCO_3$, 6.102 g $SiO_2$, 1.900 g $Si_3N_{4/3}$ and 0.214 g $Eu_2O_3$, optionally with the addition of conventional fluxing agents, are homogenized for several hours, in particular for from 2 to 8 hours.

The charge mixture is annealed in $Al_2O_3$ crucibles with a lid under reducing conditions, preferably forming gas, at about 1200 to 1400° C. for several hours, in particular from 3 to 10 hours. The term reducing conditions is intended to mean the use of an inert gas, preferably $N_2$ with the addition of $H_2$. The $H_2$ component in the forming gas should be from 0 to 20% (including the endpoint values); for example, 4% $H_2$ are used.

The anneal cake is ground in the conventional way, and the phosphor powder is then optionally subjected to a second anneal at from 850 to 1450° C. under reducing conditions (forming gas). The $H_2$ component in the forming gas should be from 0 to 20% (including the endpoint values); for example, 4% $H_2$ are used.

In a second exemplary embodiment, the production method is similar but the following weigh-in of the starting substances is selected for the target stoichiometry $Ba_2Si_5O_9N_2$:
11.473 g $BaCO_3$, 6.238 g $SiO_2$, 2.081 g $Si_3N_4$ and 0.209 g $Eu_2O_3$.

In a third exemplary embodiment, the production method is similar but the following weigh-in of the starting substances is selected for a preferred target stoichiometry $Ba_9Si_{21}O_{36}N_{10}$:
11.864 g $BaCO_3$, 5.529 g $SiO_2$, 2.391 g $Si_3N_4$ and 0.216 g $Eu_2O_3$.

It is advantageous to use typical fluxing agents such as fluorides, chlorides and oxides (see Tab. 1). Specific exemplary embodiments are $BaF_2$ or $BaCl_2$, as well as other compounds studied in Tab. 1

The charge stoichiometry is not identical to the product stoichiometry, but serves as a rough guide. For example, according to elementary analysis, the charge stoichiometry $BaSi_{2.3}O_{4.3}N_{0.9}$ leads to a phosphor with the approximate product stoichiometry $Ba_2Si_5O_9N_2$. The indices of the product stoichiometries as indicated here are in general typically accurate to 10%, if the index for Ba is taken as a fixed point.

TABLE 1

| Sample BPxx/07 | Fluxing agent (additive) | Rel. QE | Rel. brightness |
|---|---|---|---|
| 230 | None | 100% | 100% |
| 311 | 2 mol % $H_3BO_3$ | 102% | 122% |
| 312 | 2 mol % $NH_4Cl$ | 102% | 119% |
| 313 | 2 mol % $BaF_2$ | 111% | 131% |
| 314 | 2 mol % $La_2O_3$ | 102% | 119% |

Figure 2:
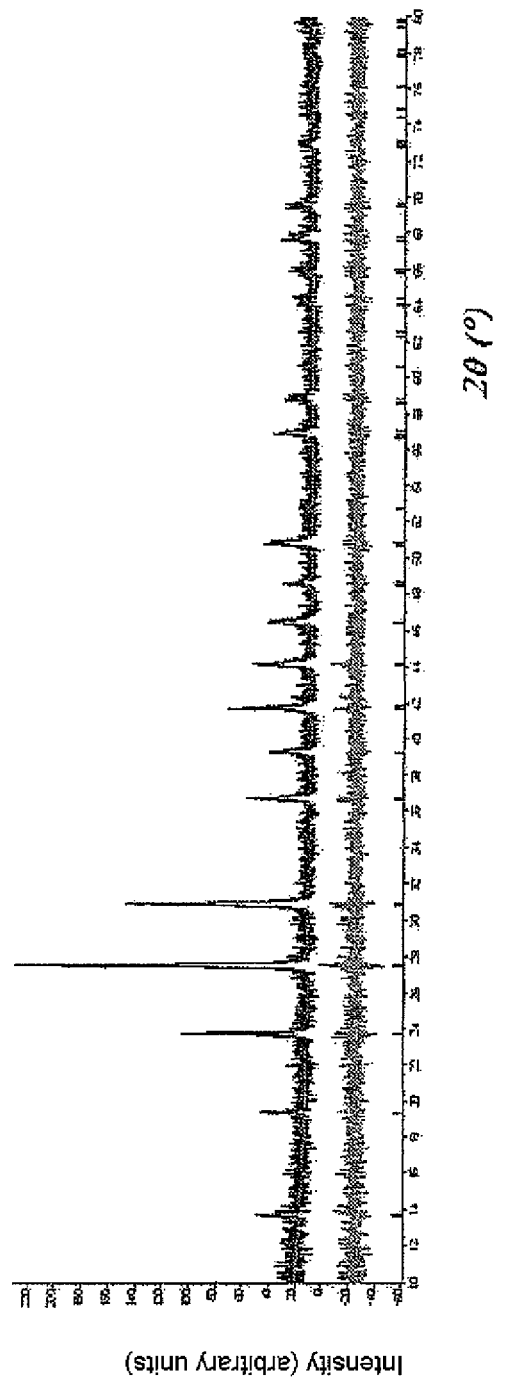
FIG. 2 shows the XRD reflections of a novel phosphor.

FIG. 2 shows the XRD reflections of the novel phosphor. The XRD reflections of the new phase can be described best with a trigonal or hexagonal space group with a=7.5094(1) Å and c=6.4753(1) Å with a cell volume V=316.23 Å$^3$. The space groups P3 or P-3 give an unequivocal description of the barium positions taking into account the volume increments of possible composition.

Tab. 2 shows the reflections with the position of the reflections with lattice plane spacings $d_{hkl}$ and estimated peak intensities. The errors in the lattice spacings may be up to +−2%.

TABLE 2

| Reflection Positions and Intensities | | |
|---|---|---|
| Reflection No. | $d_{hkl}$ (Å) | Intensity |
| 1 | 6.49 | Medium |
| 2 | 4.59 | Medium |
| 3 | 3.75 | Strong |
| 4 | 3.25 | Strong |
| 5 | 2.90 | Strong |
| 6 | 2.45 | Medium |
| 7 | 2.30 | Medium |
| 8 | 2.16 | Medium |
| 9 | 2.05 | Medium |
| 10 | 1.96 | Medium |
| 11 | 1.87 | Weak |
| 12 | 1.80 | Medium |
| 13 | 1.62 | Medium |
| 14 | 1.58 | Weak |
| 15 | 1.45 | Weak |
| 16 | 1.42 | Weak |
| 17 | 1.38 | Weak |
| 18 | 1.35 | Weak |
| 19 | 1.30 | Weak |
| 20 | 1.27 | Weak |
| 21 | 1.25 | Weak |
| 22 | 1.23 | Weak |
| 23 | 1.21 | Weak |

Figure 3:
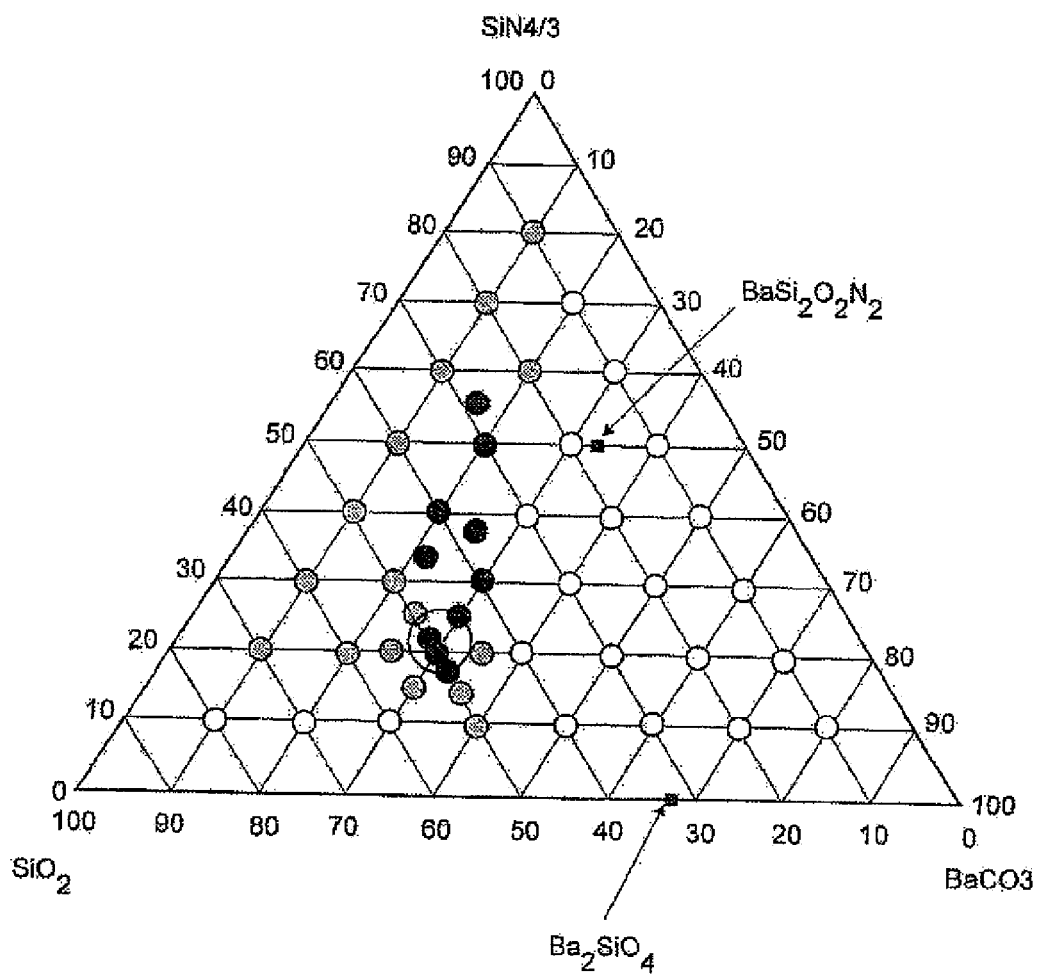
FIG. 3 shows an overview of the phase diagram of the system of the educts $BaCO_3$—$SiN_{4/3}$—$SiO_2$ with 2% Eu for Ba.

FIG. 3 shows an overview of the phase diagram of the system of the educts $BaCO_3$—$SiN_{4/3}$—$SiO_2$ with 2% Eu for Ba.

The two most important already known phosphor phases in the system are:
the blue-green $BaSi_2O_2N_2$:Eu and the blue-green $Ba_2SiO_4$:Eu. These two are denoted by arrows. Both systems show a much worse temperature response than the phosphor according to the invention. The circle denotes the particularly high-efficiency region of the new phase. Virtually or entirely pure-phase novel phosphors are denoted by a black circle, mixed phases with other phases by a shaded circle and other phases alone by a white circle. Depending on the charge stoichiometry, the other phases are $Si_3N_4$, Ba orthosilicate, $SiO_2$, $Ba_2Si_5N_8$, $BaSiO_3$, $BaSi_2O_5$, BaO, $Ba_3SiO_5$ and $Ba_2Si_3O_8$. Good results for the novel phase are provided by a charge stoichiometry which lies approximately in a square with the following corners:

(1) $SiO_2:SiN_{4/3}:BaCO_3=0.525:0.25:0.225$
(corresponding to $Ba_{1.8}Si_{6.2}O_{10.2}N_{2.67}$);
(2) $SiO_2:SiN_{4/3}:BaCO_3=0.425:0.25:0.325$
(corresponding to $Ba_{2.6}Si_{5.4}O_{9.4}N_{2.67}$);
(3) $SiO_2:SiN_{4/3}:BaCO_3=0.475:0.15:0.375$
(corresponding to $Ba_3Si_5O_{10.62}N_{1.6}$);
(4) $SiO_2:SiN_{4/3}:BaCO_3=0.575:0.15:0.275$
(corresponding to $Ba_{2.2}Si_{5.8}O_{11.4}N_{1.6}$).

The novel phase composition exhibits a particularly pure phase when the $BaCO_3:SiO_2$ ratio in the charge mixture is between 1:1.5 and 1:2. $SiN_{4/3}$ is then added thereto. Overall, the $SiN_{4/3}$ component should be at least 15%, and at most 55%. The best samples are obtained with 20-30% $SiN_{4/3}$.

Tab. 3 shows screening of the phase space, the phosphor efficiencies, the color loci and the dominant emission wavelength for 400 nm excitation with a 2% Eu activator concentration (substitution of Ba site) being specified.

With 2% Eu doping, the new phase typically emits at about $\lambda$dom=537±3 nm. All other known pure Eu-doped Ba silicates and Ba—SiONs emit at much shorter wavelengths. In this regard reference is made to sample BP128/07, which comprises only Ba silicate as a phosphor compound. The phosphor $BaSi_2O_2N_2$:Eu (about 500 nm) is not in fact formed at all with the selected synthesis conditions—in particular with this low temperature.

Tabs 4a/4b show the efficiencies of selected charge stoichiometries (high phase purity) for various Eu concentrations, and specifically for excitation wavelengths of 400 and 460 nm respectively.

A second anneal (samples with index 'a') generally improves the crystallinity and thus increases the efficiency of the samples. For 460 nm excitation, somewhat higher Eu concentrations are generally advantageous. This corresponds to what is found when studying the excitation spectra.

Figure 4:
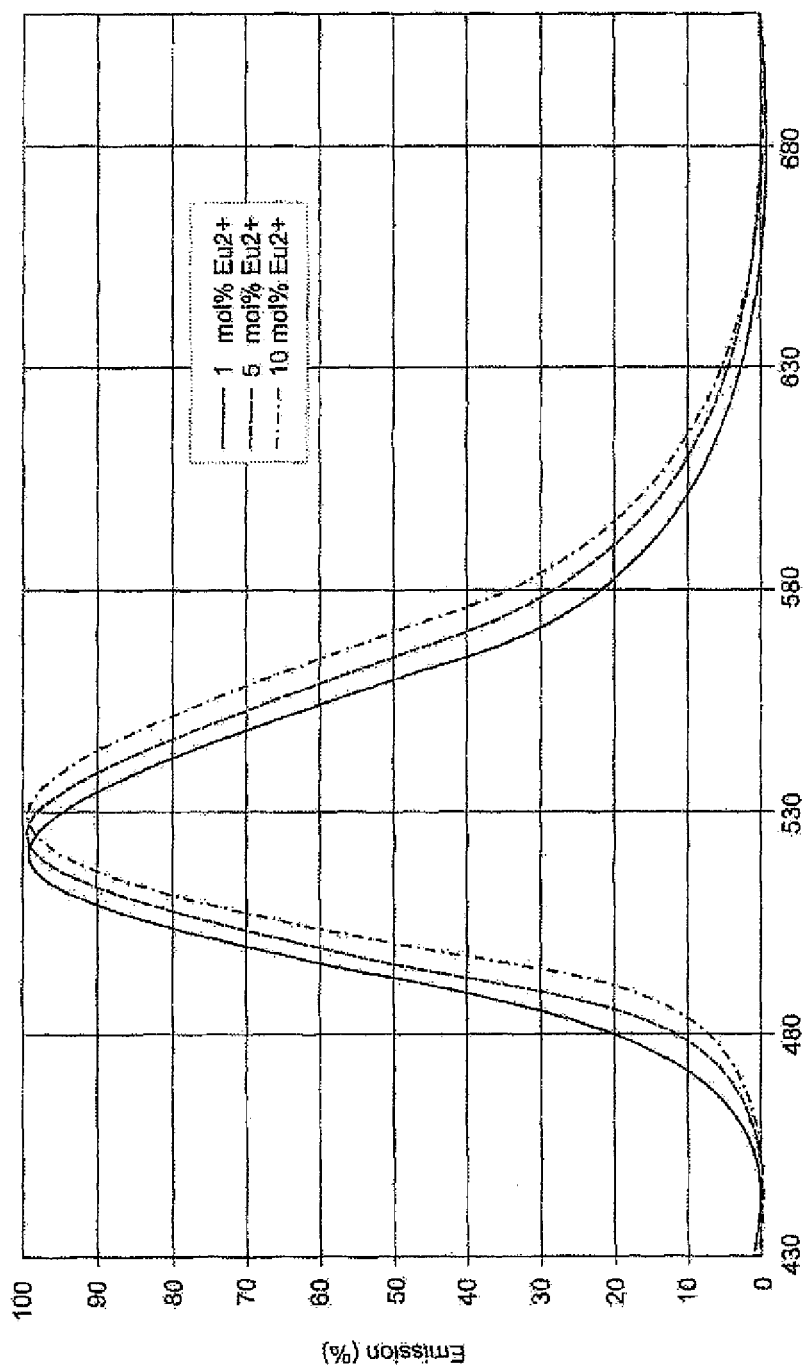
FIG. 4 shows the emission spectra with the charge stoichiometry $Ba_{2-x}Eu_xSi_5O_9N_2$ for various Eu concentrations.

FIG. 4 shows the emission spectra with the charge stoichiometry $Ba_{2-x}Eu_xSi_5O_9N_2$ for various Eu concentrations in the range of from x=0.02 to x=0.2. They correspond to 1, 5 and 10 mol % of M. Higher Eu concentrations are nevertheless readily possible.

Figure 5:
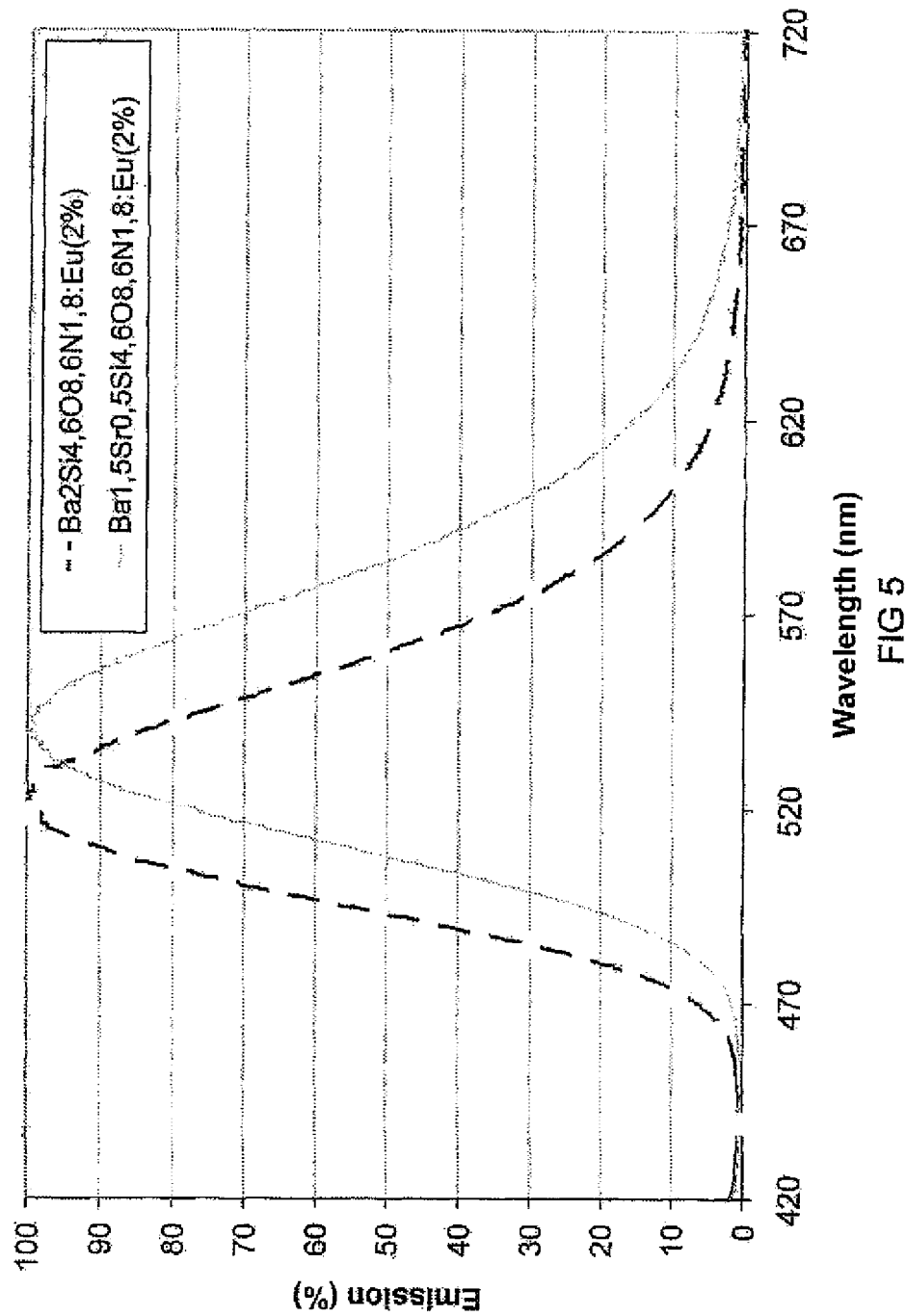
FIG. 5 shows emission spectra with the charge stoichiometry $Ba_{2-x-y}Sr_yEu_xSi_{4.6}O_{9.2}N_{1.8}$.

FIG. 5 shows emission spectra with the charge stoichiometry $Ba_{2-x-y}Sr_yEu_xSi_{4.6}O_{9.2}N_{1.8}$ for fixed x=0.04 (2% Eu) with y=0 and y=0.48 (about 25% Sr for Ba). As expected, and the incorporation of a smaller ions such as Sr leads to longer-wavelength emission. A smaller ion leads to a stronger interaction with the surrounding lattice atoms, and this in turn leads to a long-wavelength shift. Specifically, the emission is shifted here by about 20 nm from 523 nm to 543 nm, i.e. the novel phosphor can readily be adapted to corresponding applications.

Figure 6:
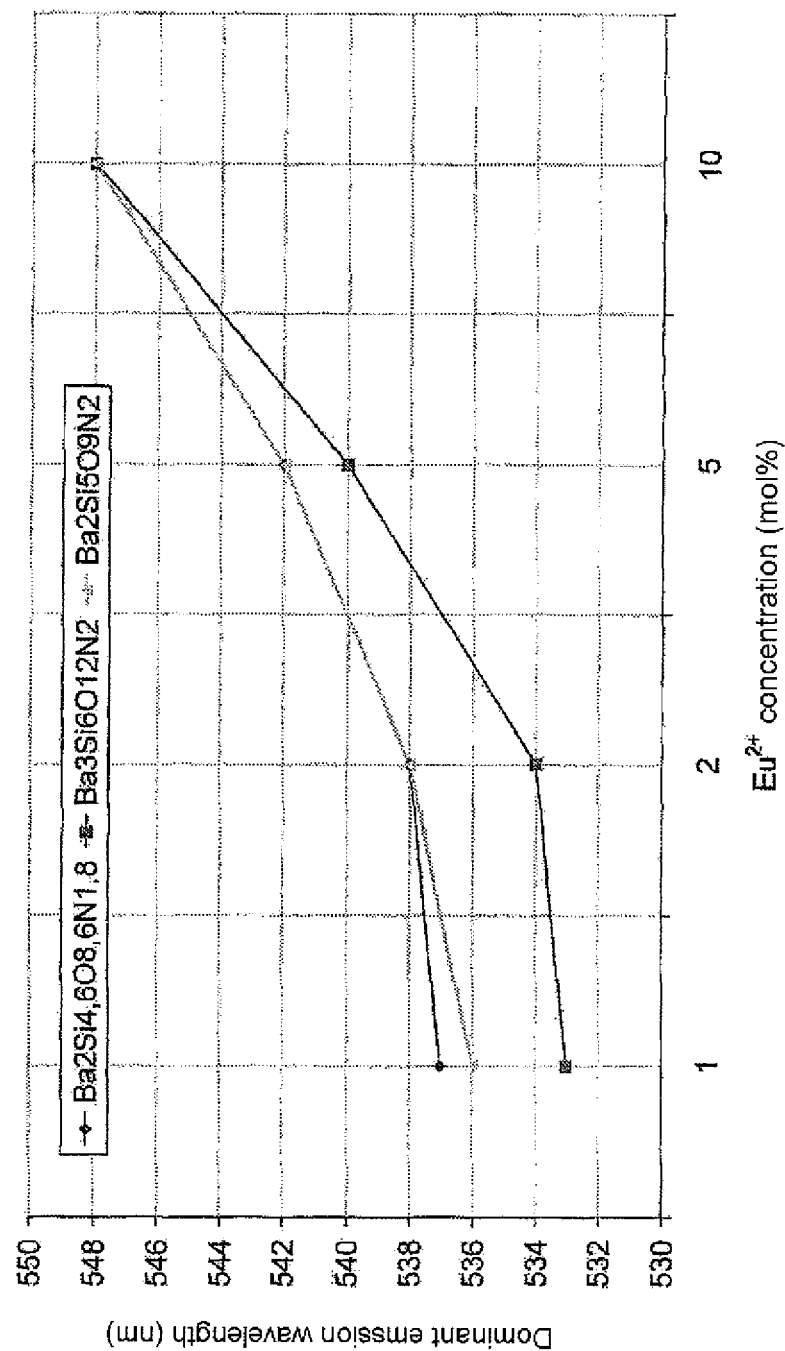
FIG. 6 shows the emission spectra with various charge stoichiometries.

FIG. 6 shows the emission wavelength with three different charge stoichiometries. With charge stoichiometries close to the phase determined by chemical analysis, roughly $Ba_2Si_5O_9N_2$, a very similar dominant emission wavelength of the Eu-doped phosphor is respectively found.

Figure 7:
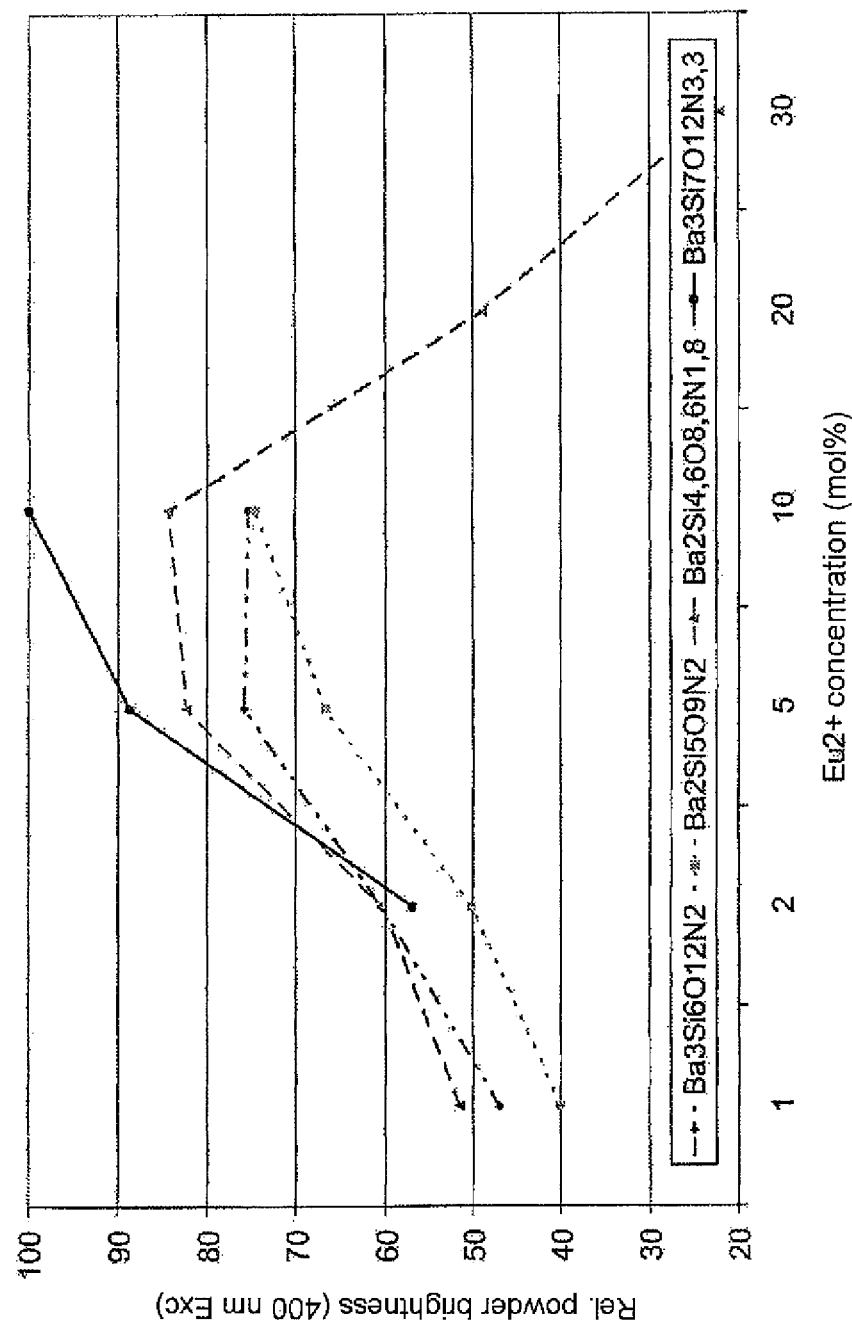
FIG. 7 shows the powder brightness as a function of the activator concentration with 400 nm excitation.

FIG. 7 shows the relative powder brightness as a function of the activator concentration with an excitation wavelength of 400 nm. The preferred Eu concentration lies between 5 and 15% Eu.

Figure 8:
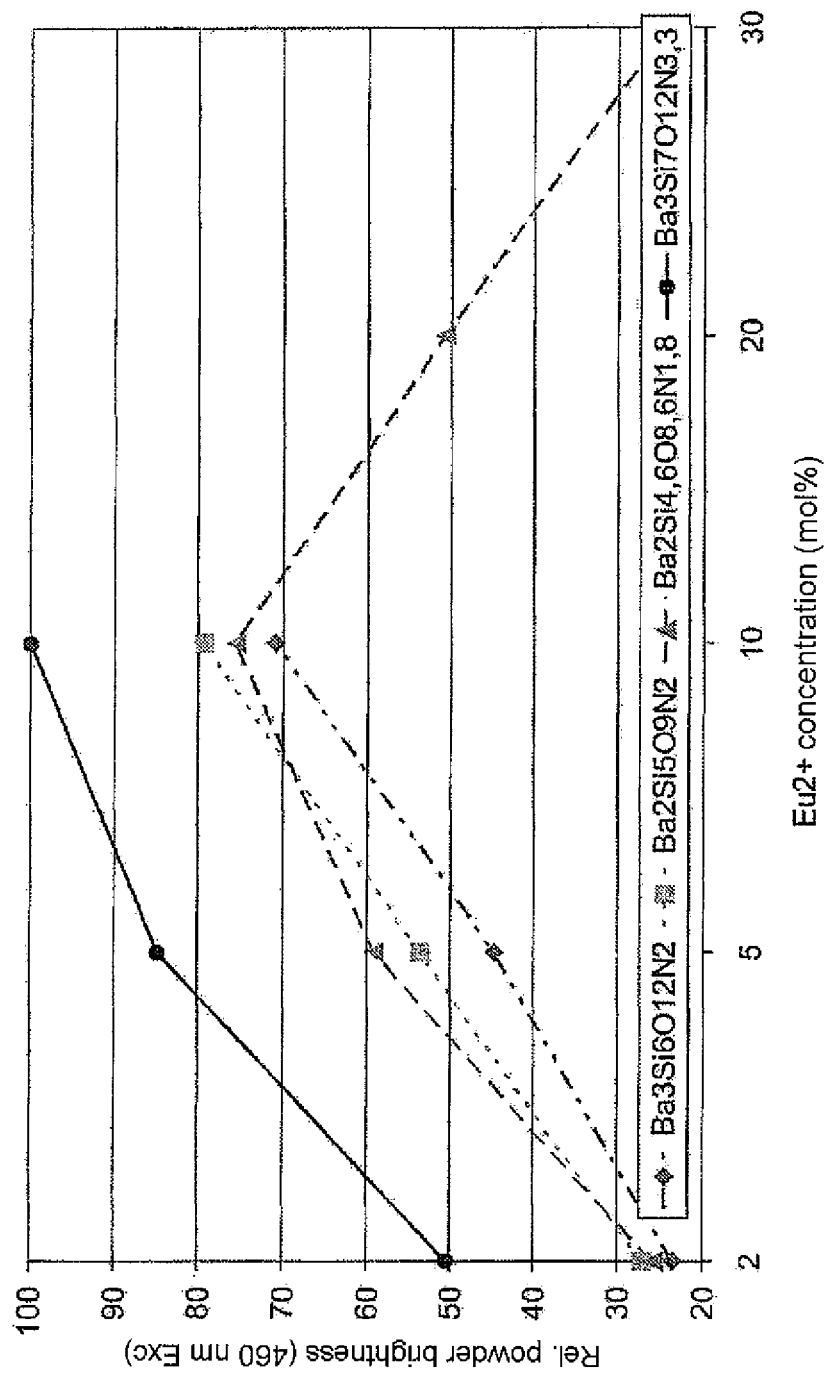
FIG. 8 shows the powder brightness as a function of the activator concentration with 460 nm excitation.

FIG. 8 shows the relative powder brightness as a function of the activator concentration with the excitation wavelength 460 nm. The preferred Eu concentration lies between 5 and 15 mol % Eu. This powder brightness is a measure of the ratio between the number of radiated photons and the number of incident photons.

Figure 9:
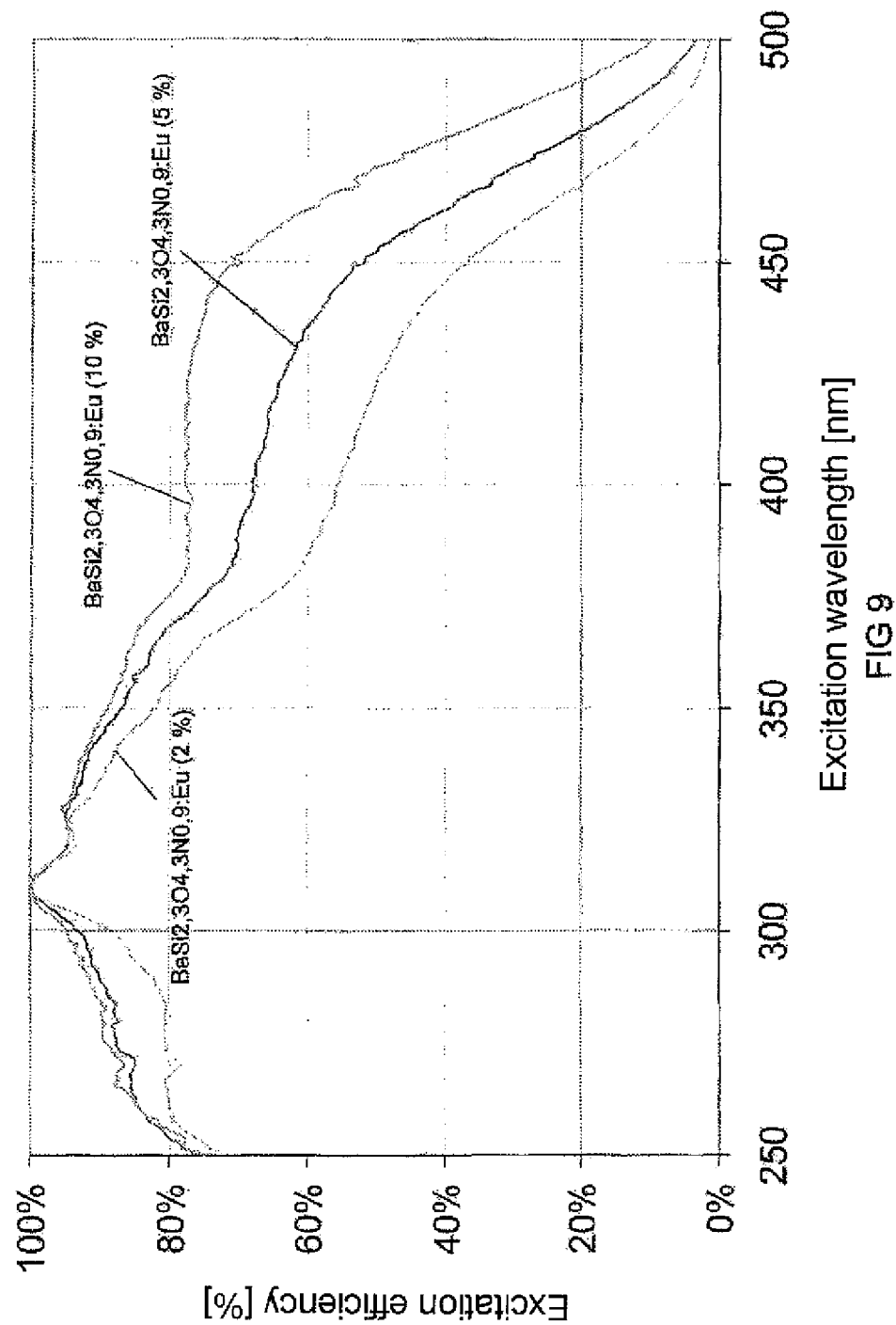
FIG. 9 shows the excitability of the new Ba—SiONs with different Eu concentrations.

FIG. 9 shows the excitability of the new Ba—SiON (here, charge stoichiometry $Ba_{2-x}Eu_xSi_{4.6}O_{9.2}N_{1.8}$) with different Eu concentrations. The phosphor can be excited well in a wide spectral range of about 250 to 470 nm.

Figure 10:
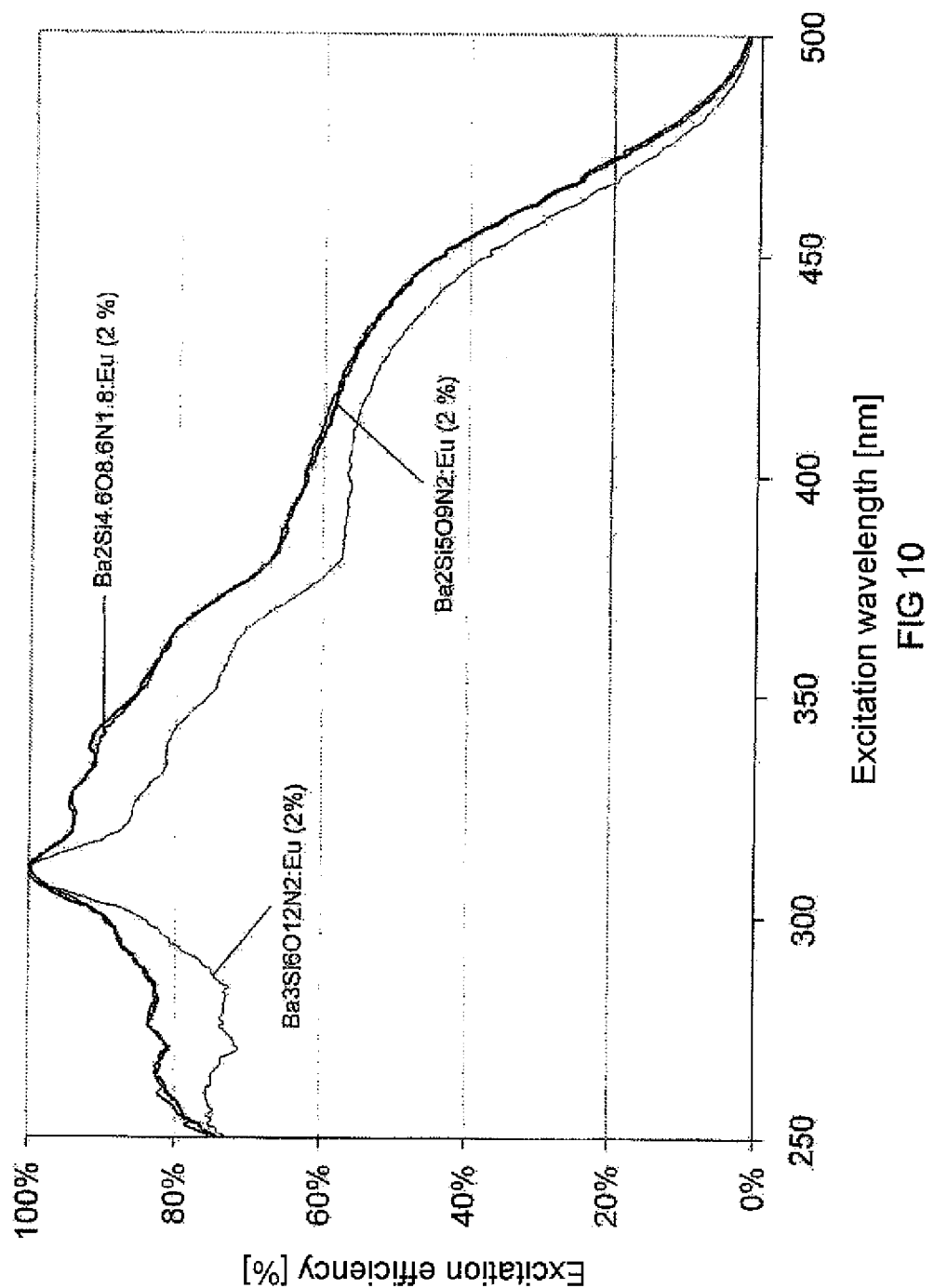
FIG. 10 shows the excitability of the new Ba—SiONs for various charge mixtures.

FIG. 10 shows the excitability of the new Ba—SiON (here: three different charge mixtures). Relatively independently of the exact charge stoichiometry, a similar excitation spectrum is respectively obtained for the specified charge stoichiometries. With the sample $Ba_3Si_6O_{12}N_2$, which has a 2% Eu component, a minor heterogeneous phase component leads to a slight deformation of the spectrum.

The phosphors according to the invention can also be used in connection with other UV or blue light sources such as molecular radiators (for example In discharge lamps), or blue OLEDs or in combination with blue EL phosphors.

They make it possible to produce efficient color-stable LEDs or LED modules based on a conversion LED. Other fields of application are LEDs with good color rendering, color-on-demand LEDs or white OLEDs. The new phosphor can also be used in conventional lamps, but also for electrical devices such as CRTs, PDPs, FEDs etc.

Figure 11:
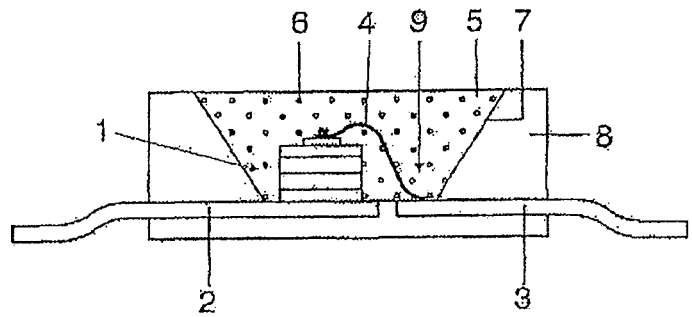
FIG. 11 shows the basic structure of a light source for green light.

The basic structure of a light source for green light is explicitly shown in FIG. 11. The light source is a semiconductor component having a chip 1 of the InGaN type with a peak emission wavelength in the UV range, for example 405 nm, which is embedded in an opaque base package 8 in the region of a recess 9. The chip 1 is connected via a bonding wire 4 to a first terminal 3, and directly to a second electrical terminal 2. The recess 9 is filled with an encapsulation compound 5, which contains as main constituents a silicone resin (80 to 90 wt %) and phosphor pigments 6 (typically less than 20 wt %). The recess has a wall 7, which acts as a reflector for the primary and secondary radiation of the chip 1, or the pigments 6. The primary radiation of the UV LED is fully converted into green light by the phosphor. The phosphors used is the Ba—SiON $Ba_2Si_5O_9N_2$:Eu described above.

A light source for white light can be produced in a similar way by using three phosphors, which are excited by the UV radiation source, to emit red, green and blue light. The green phosphor is the novel Ba—SiON $Ba_2Si_5O_9N_2$:Eu, the red phosphor is for example $Ca_5Al_4Si_8N_{18}$:Eu or a nitridosilicate $(Ca,Sr)_2Si_5N_8$:Eu and the blue phosphor is for example an aluminate or phosphate phosphor, such as BAM:Eu or SCAP:Eu or the like.

Figure 12:
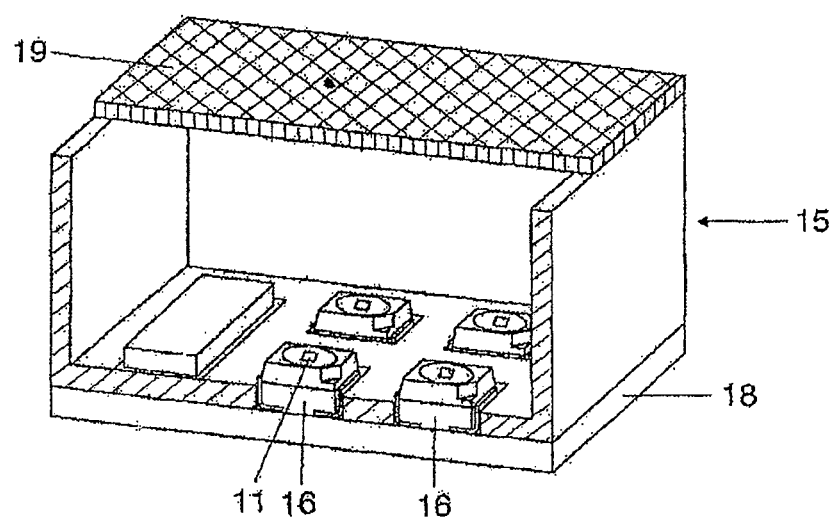
FIG. 12 shows the basic structure of a light source for white light.

The structure of another light source for white light is explicitly shown in FIG. 12. The light source is a semiconductor component 16 of the LED type having a blue-emitting chip 11 of the InGaN type with a peak emission wavelength of for example 460 nm. The semiconductor component 16 is embedded in an opaque base package 18 with a side wall 15 and a lid 19. The chip is the primary light source for two phosphors. The first phosphor 14 is the oxynitridosilicate $Ba_2Si_5O_9N_2$:Eu(10%), which partially converts the primary radiation of the chip 13 and transforms it into green radiation with a peak emission of 530 nm. The second phosphor is the novel nitridosilicate $(Ca,Sr,Mg)_5Al_4Si_8N_{18}$:Eu, which partially converts the primary radiation of the chip 13 and transforms it into red radiation with a peak emission of 630-660 nm.

A particular advantage of using a long-wavelength primary light source (450 to 465 nm) for the luminescence conversion LED is that it avoids problems with ageing and degradation of the package and resin or phosphor, so that a long lifetime is achieved.

In another exemplary embodiment, a UV LED (about 380 nm) is used as a primary light source for a white RGB luminescence conversion LED, in which case problems with ageing and degradation of the package and resin or phosphor must be avoided as much as possible by additional measures known per se, such as careful selection of the package material, adding UV-resistant resin components. The great advantage of this solution is the low viewing angle dependency of the emission, and the high color stability.

Figure 13:
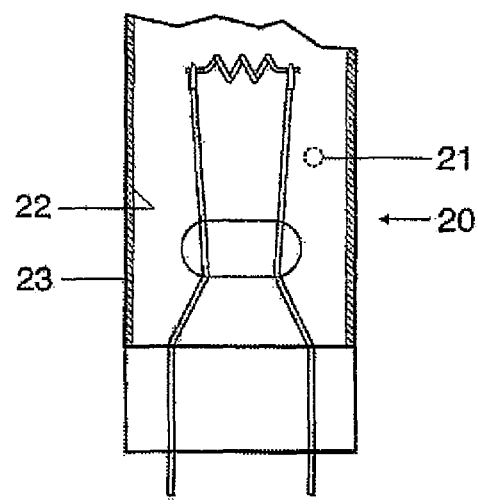
FIG. 13 shows the basic structure of a discharge lamp.

FIG. 13 shows a low-pressure discharge lamp 20 with a mercury-free gas fill 21 (schematized) which contains an indium compound and a buffer gas similarly as in WO 02/10374, wherein a layer 22 of Ba—SiON is provided on the inner surface of bulb 23. In general, so-called triple-band phosphors are used in fluorescent lamps. To this end, a blue phosphor and a red phosphor are added. BAM:Eu or $BaMgAl_{10}O_{17}$:Eu and red nitridosilicate $(Ba,Sr,Ca)_2Si_5N_8$:Eu are highly suitable.

This phosphor system is on the one hand matched to the indium radiation because it has substantial components in both the UV and blue spectral ranges, both of which are absorbed equally well. This mixture is moreover also suitable for conventional fluorescent lamps. It may also be used in an indium lamp based on high pressure, as is known per se from U.S. Pat. No. 4,810,938. Green improvement is possible. The lamp has a conventional discharge vessel with a metal halide fill. The radiation strikes a phosphor layer on the outer bulb, which converts part of the primary radiation into green radiation components. The phosphor layer consists of Ba—SiON: Eu. This technique is described in principle for example in U.S. Pat. No. 6,958,575.

Further information is contained in Tabs 4a and 4b below. Tab. 4a relates to excitation with a wavelength of 400 nm. Tab. 4b relates to excitation with a wavelength of 460 nm. For various exemplary embodiments, the two tables shows the weigh-in stoichiometry, the concentration of the activator, the color locus components x and y, the dominant wavelength, the relative quantum efficiency Q.E. and the relative brightness in percent.

Another exemplary embodiment is an LED module consisting of at least one set of three light-emitting LEDs, red, green and blue. This RGB module is used for the excitation of LCD display screens or RPTV devices. The green LED is a primarily UV-emitting pc-LED (phosphor conversion LED), which is converted by means of a novel green Ba—SiON into green radiation. The peak wavelength of the UV LED is in particular 400 nm. The temperature rises slightly during operation of the module to 200° C., which the thermally stable phosphor copes with easily.

In principle, it is also possible to replace Si at least partially by Ge, preferably by up to 20 mol %. Full replacement is nevertheless also possible.

Instead of Ba and/or Sr alone, Ca and/or Mg and/or Zn and/or Cu may also be constituents of the cation M. The proportion is preferably not more than 30 mol % of the cation M.

Instead of only with Eu and/or Ce, the novel phosphor may also be codoped with Mn or Yb as well. Good results are provided in particular by Eu,Yb codoping. Furthermore, $Tb^{3+}$ may also be used as an activator, alone or in combination with the others. While doping with Ce leads to a UV- to blue-emitting phosphor under UV excitation, particularly with the known Hg line 254 nm, the pure Tb variant emits green with the same UV excitation.

Figure 14:
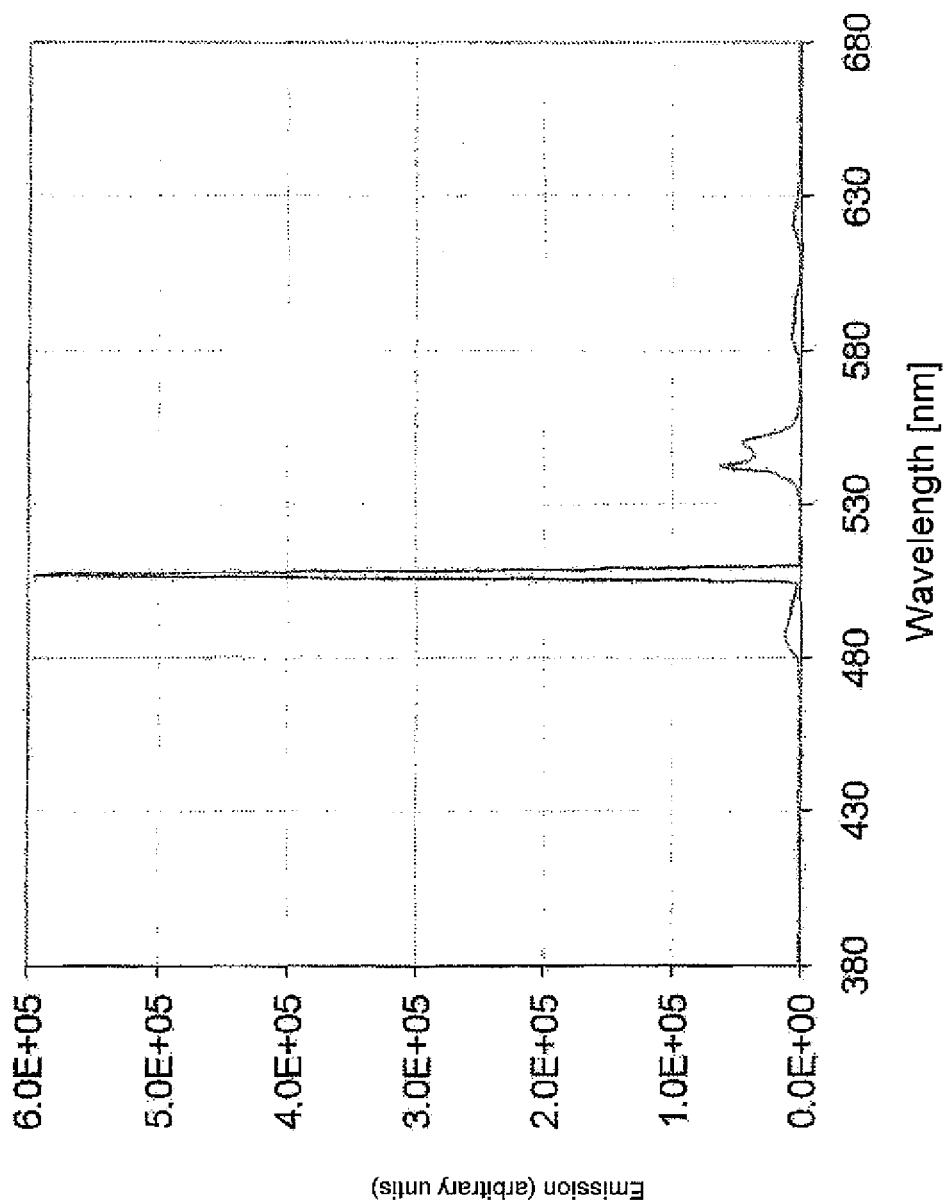
FIG. 14 shows the emission spectrum of a $Tb^{3+}$-doped sample of the phosphor $(Ba_{0.95}Tb_{0.05})_2Si_5O_9N_2$.

FIG. 14 shows the emission spectrum of a $Tb^{3+}$-doped sample of the phosphor $(Ba_{0.95}Tb_{0.05})_2Si_5O_9N_2$ with excitation in the UV range at 254 nm. This $Tb^{3+}$-doped sample shows a typical line emission, as is often observed in the case of $Tb^{3+}$ emission. This phosphor may furthermore be sensitized with Ce, according to the formula $Ba_2Si_5O_9N_2$:(Tb,Ce). For this phosphor, the excitability tends to be at a longer wavelength and more resembles that of the pure Ce-doped sample.

Figure 15:
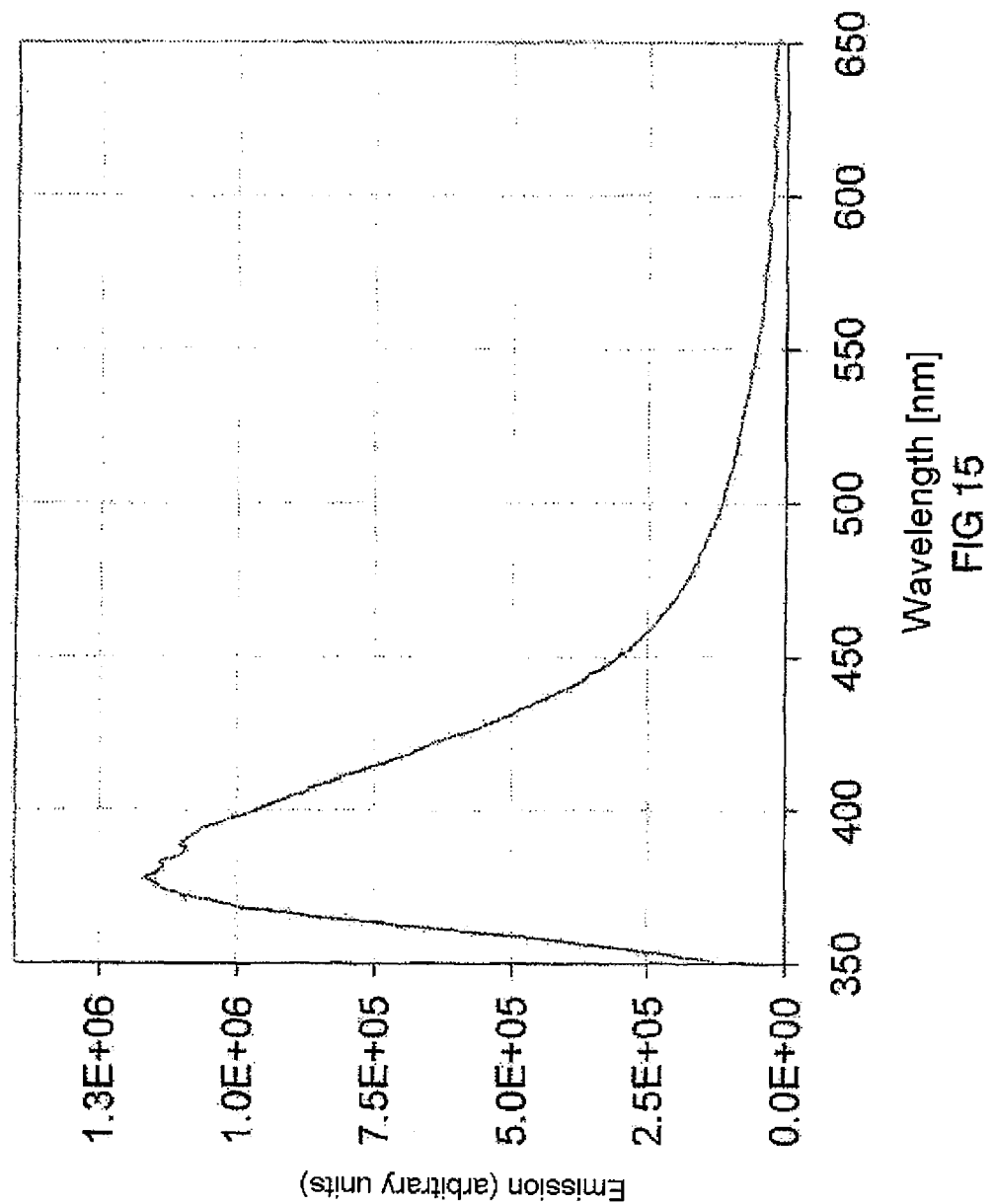
FIG. 15 shows the emission spectrum of a $Ce^{3+}$-doped sample of the phosphor $(Ba_{0.98}Ce_{0.02})_2Si_5O_9N_2$.
Figure 16:
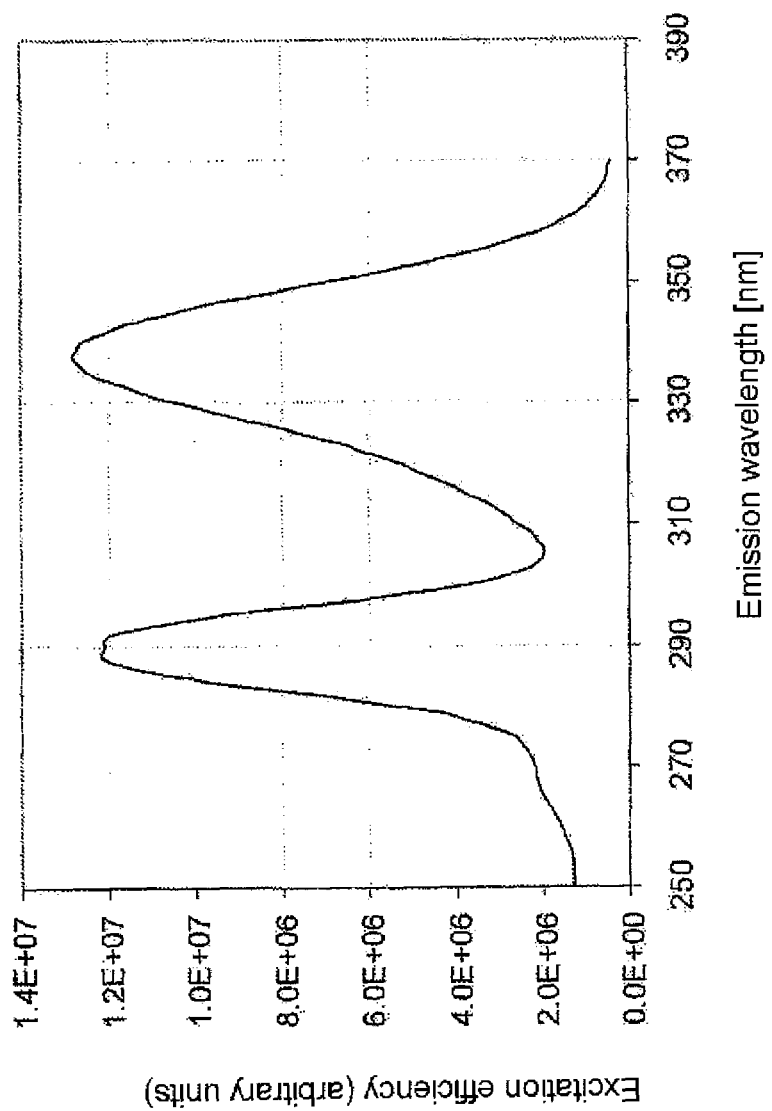
FIG. 16 shows the excitation spectrum of a $Ce^{3+}$-doped sample of the phosphor $(Ba_{0.98}Ce_{0.02})_2Si_5O_9N_2$.

FIG. 15 shows the emission spectrum of the Ce-doped sample $(Ba_{0.98}Ce_{0.02})_2Si_5O_9N_2$ for excitation at 338 nm. This exemplary embodiment gives blue-violet illumination. FIG. 16 shows the excitation spectrum of the same sample, the emission having been observed at 378 nm.

Tab. 5 contrasts various doped phosphors of the $Ba_2Si_5O_9N_2$:D type with the doping D=Eu, D=Ce or D=Tb, as well as D=(Eu,Mn) and D=(Eu,Ce). The color locus components x and y are respectively specified. The Eu-doped exemplary embodiment is used as a reference. In comparison therewith, an (Ea,Ce)-codoped sample shows no shift of the color locus since the Ce band for excitation in the range of from 370 to 400 nm is not significant.

The Ce-doped sample gives blue-violet illumination. The Tb-doped sample is found to be a green line radiator. Incorporation of $Mn^{2+}$ as codoping with $Eu^{2+}$ is possible in small amounts. Ce-doped and Ce,Tb-codoped phosphors are also suitable for fluorescent lamps or other UV light sources such as excimer radiators, which excite in the far UV range and for example use triple-band mixing. By means of the novel Ce-doped and Ce,Tb-codoped SiON phosphors, it is therefore even possible to produce a light source for near UV or with peak emission at about 380 to 390 nm. In this case, the SiON is the only phosphor. The excitation, which is readily possible in the range of from 250 to 375 nm, is achieved particularly efficiently in the range of from 290 to 340 nm.

In general the efficiency, particularly of the $Tb^{3+}$ and $Ce^{3+}$-doped exemplary embodiments, can be optimized when incorporating therein small amounts of $Li^+$ and/or $Na^+$, which are used for charge compensation. Either the additional positive charge can generally be introduced by means of monovalent ions such as Li or Na, or alternatively a slight modification of the Ba/Si ratio or a slight modification of the O/N ratio may be carried out.

What is essential is the property of the new thermally stable phosphor, that it comes from the M-Si—O—N system having a cation M, M being represented by Ba or Sr alone or as a mixture or may additionally be combined with at least one other element from the group Ca, Mg, Zn, Cu, the phosphor being activated with Eu or Tb alone or as a mixture, optionally in codoping with Mn, the activator D partially replacing the cation M. Since the phosphor is produced from the charge stoichiometry $MO—Si_3O_2—Si_3N_4$ with an increased oxygen content relative to the known phosphor $MSi_2O_2N_2$, it preferably has essentially the composition $aMO \times bSiO_2 \times c\,Si_3N_4$. Its stoichiometry therefore essentially follows the formula $M_aSi_{b+3c}O_{a+2b}N_{4c}$.

Here, it is not necessary for a,b,c to be integers. The phosphor is furthermore distinguished in that the ratio O:M is >1 and in that the ratio O:Si is >2.

Particularly good results are shown by a phosphor in which the relations between a, b and c are kept so that: b:c=4.8 to 8.0 and/or a:c=3.5 to 5.5. Preferably, b:c lies in the range of from 5 to 6 and/or a:c lies in the range of from 3.5 to 4.

A phosphor which is particularly outstanding in this regard has the charge stoichiometry $Ba_9Si_{21}O_{36}N_{10}$, or expressed another way $Ba_3Si_7O_{12}N_{3.3}$. This phosphor can be produced with particularly high phase purity by the production method indicated above, and shows excellent efficiency.

Figure 17:
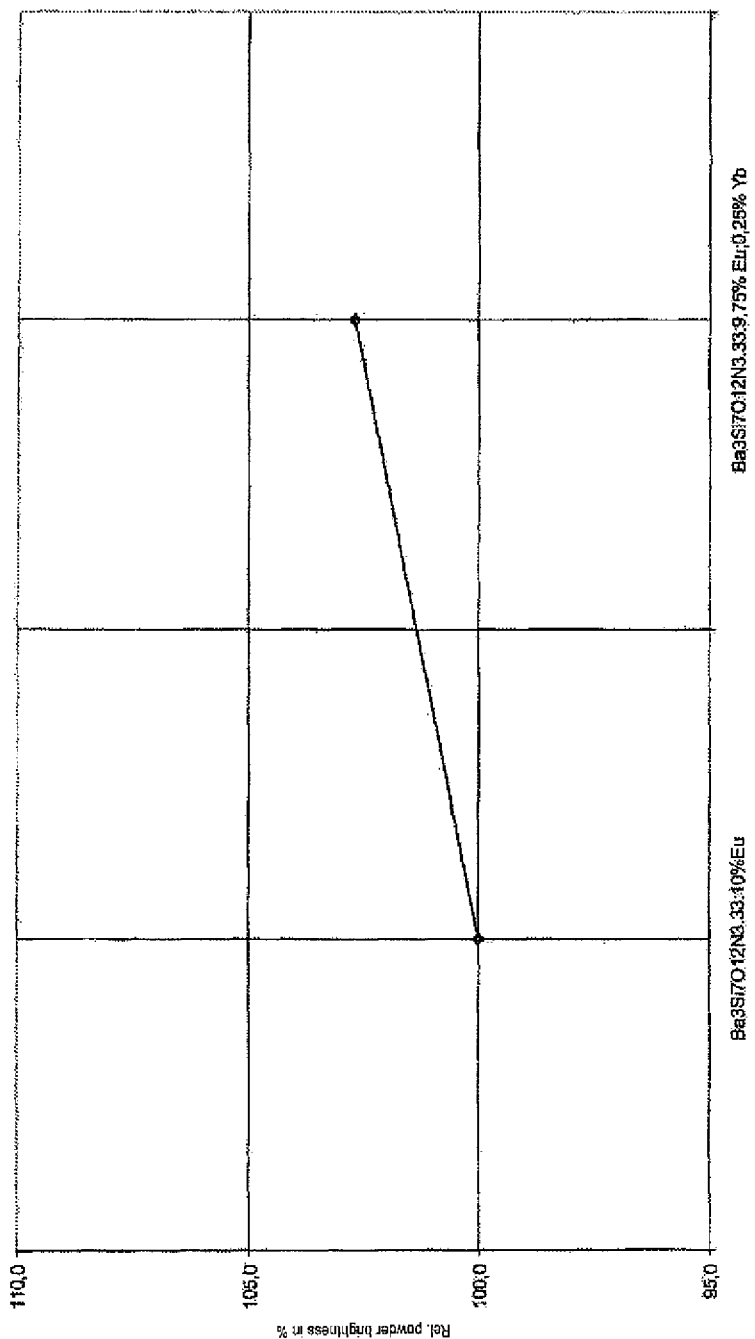
FIG. 17 shows a comparison of the powder brightness with pure Eu doping and codoping with Yb.

FIG. 17 shows a comparison of the powder brightness of a phosphor with the charge stoichiometry $Ba_3Si_7O_{12}N_{3.3}$:D, a sample with D=10% Eu expressed in terms of the Ba component having been compared with a sample of the same type, but with the difference that here D=9.75% Eu+0.25% Yb was selected. FIG. 17 shows that the addition of Yb leads to an about 3% higher powder brightness, compared with pure Eu doping.

Figure 18:
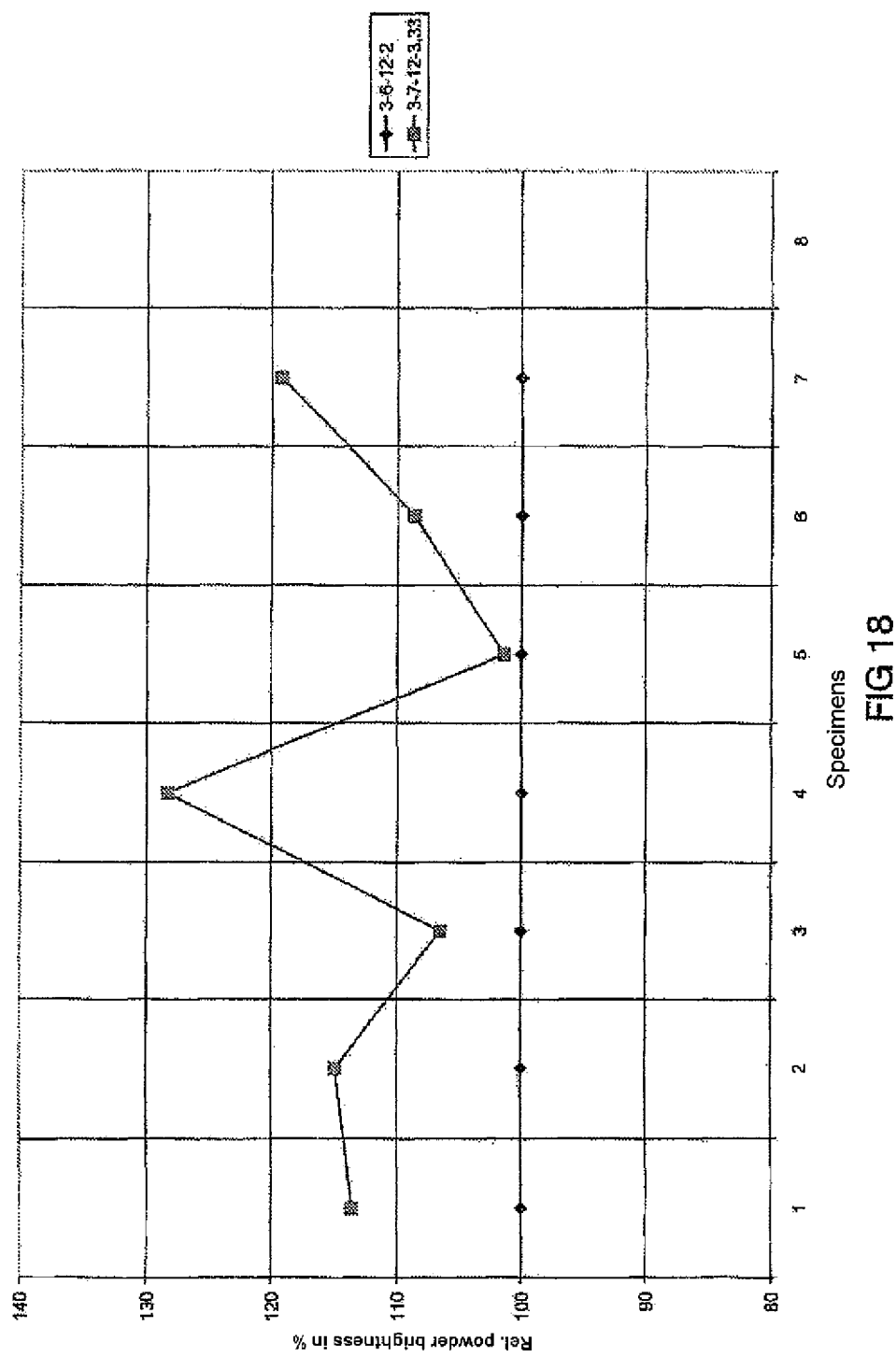
FIG. 18 shows a comparison of the powder brightness for various charge stoichiometries.

FIG. 18 shows a comparison of the powder brightness of an Eu-doped phosphor type with the charge stoichiometry $Ba_3Si_7O_{12}N_{3.33}$, relative to the powder brightness of the phosphor type with the charge stoichiometry $Ba_3Si_6O_{12}N_2$. In this case, the production conditions were varied in the same way, which led to the specimens 1 to 7. Irrespective of the production conditions, the powder brightness of the phosphor with the charge stoichiometry $Ba_3Si_7O_{12}N_{3.33}$ is always higher, and specifically between 2 and 28% higher than that of a phosphor which is based on a weigh-in according to the charge stoichiometry $Ba_3Si_6O_{12}N_2$. A radiographic structure analysis of these samples with the charge stoichiometry $Ba_3Si_7O_{12}N_{3.33}$ leads to the result that these samples have the smallest linewidth (least average microdistortion) of all the samples studied. The indexing gives a trigonal or hexagonal space group with a=7.5094(1) Å and c=6.4753(1) Å with a cell volume V=316.23 Å$^3$. The space groups P3 or P-3 give an unequivocal description of the barium positions taking into account the volume increments of possible composition. From the radiographic characterization, taking into account the electroneutrality, the phosphor shows an ideal composition $Ba_{2.5}Si_6O_{11.5}N_2$. If, however, an attempt is made to produce a phosphor with the composition $Ba_3Si_6O_{12}N_2$ by selecting $Ba_3Si_6O_{12}N_2$ as the charge stoichiometry, then essentially a phase with small lattice constants a and c and a significant component of the heterogeneous phase $BaSi_2O_5$ is obtained as an end product, cf. Tab. 3. In general, phosphors of the type with the stoichiometry $M_{2.5}Si_6O_{11.5}N_2$, where in particular M=Ba alone or predominantly at more than 50 mol %, show outstanding properties. In particular, the doping in this case is Eu or (Eu,Yb) or Ce.

Figure 19:
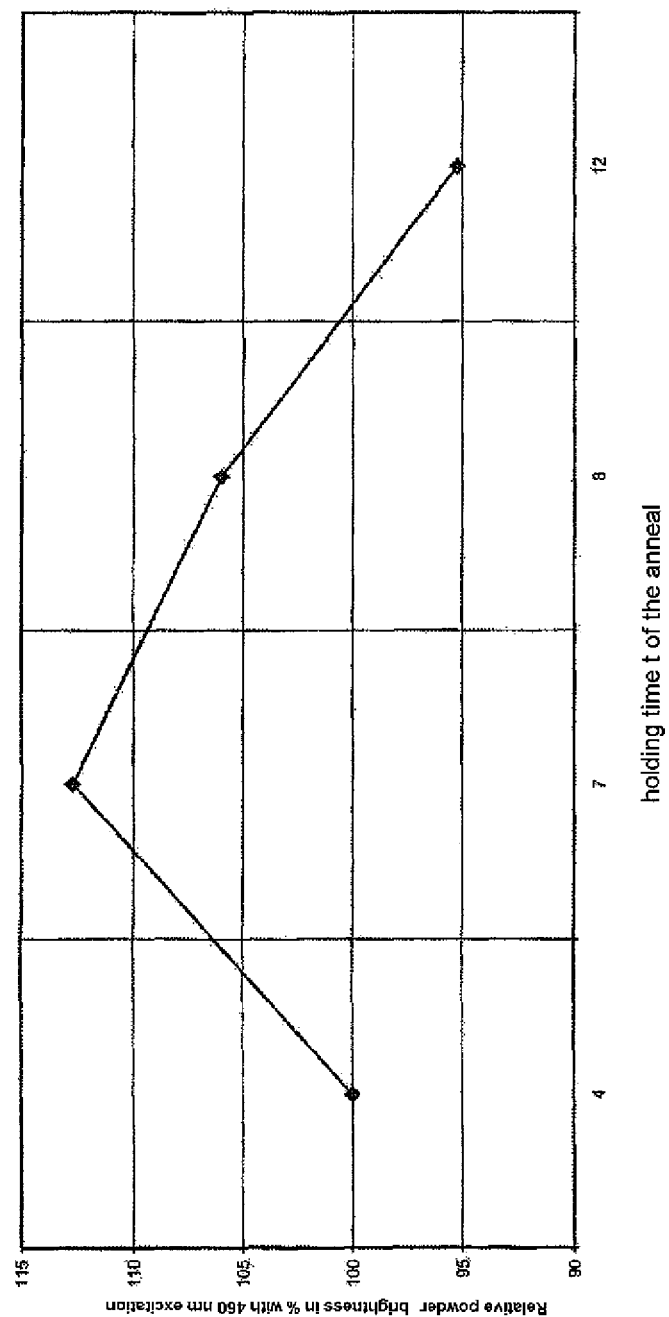
FIG. 19 shows a comparison of the powder brightness as a function of the holding time.

FIG. 19 shows a comparison of the powder brightness as a function of the holding time at high temperature. The holding time during the anneal is indicated in hours. The temperature of 1300° C. in the anneal shows an optimal holding time in the range of about 5 to 8 hours. Good results are achieved in a time period of between 4 and 10 hours.

Figure 20:
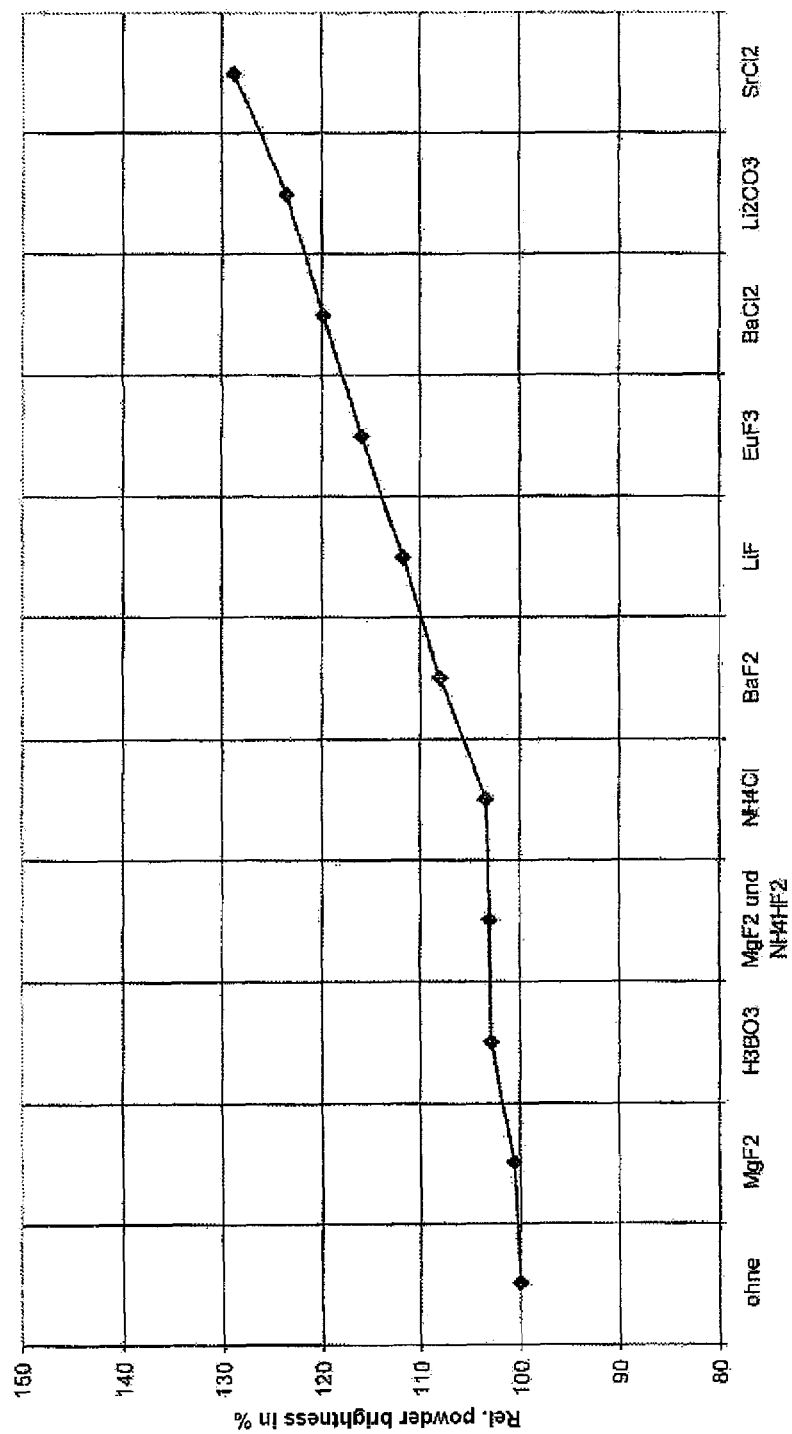
FIG. 20 shows the powder brightness as a function of the fluxing agent additive.

FIG. 20 shows the effect of the fluxing agent on the powder brightness. Fluxing agents achieve an increase in the powder brightness, which is about 2 to 30% depending on the fluxing agent. Particularly suitable are chlorides, above all of Ba and Sr, and carbonates, above all of Li. Preferred fluxing agent components in the charge stoichiometry are between 0.01 and 5 wt %, the value range of between 0.1 and 3 wt % being particularly suitable.

Figure 21:
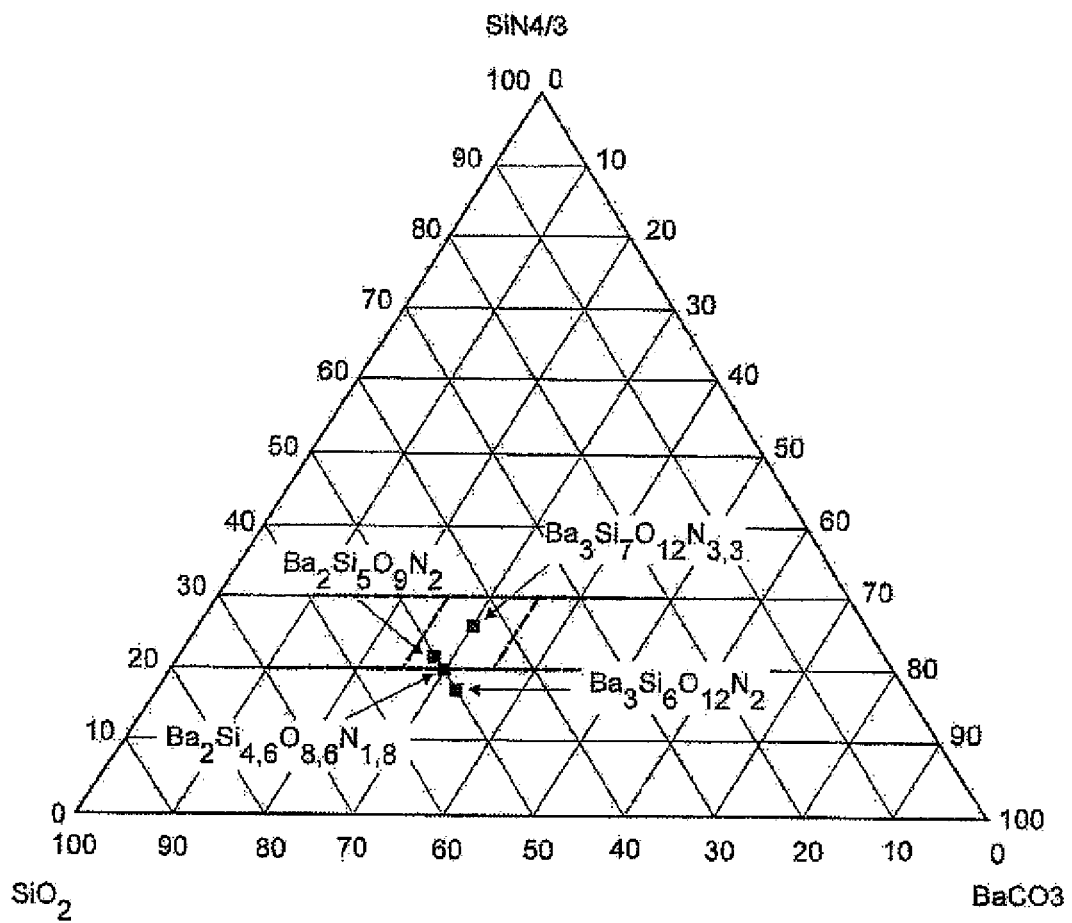
FIG. 21 shows an overview of the phase diagram of the system of the educts $BaCO_3$—$SiN_{4/3}$—$SiO_2$ with 2% Eu for Ba with the preparation of particularly suitable phosphors.

FIG. 21 represents a phase diagram similarly as in FIG. 3. The charge stoichiometries $Ba_2Si_{4.6}O_{8.6}N_{1.8}$ and $Ba_2Si_5O_9N_2$ and $Ba_3Si_7O_{12}N_{3.3}$, which show particularly high efficiency and the phase purity, are represented. They all lie in a band in which the $SiN_{4/3}$ component lies between 20% and 30%. The charge stoichiometry preferably lies in the quadrilateral indicated, which also has the $SiO_2$ component limit lines of from 65 to 75%. On the other hand, the specimen $Ba_3Si_6O_{12}N_2$ is at an $SiN_{4/3}$ component of about 17% and has much worse phase purity and efficiency. For the stoichiometry of the $Ba_3Si_7O_{12}N_{3.3}$ charge, the ratio $BaCO_3:SiO_2$ is about 1:1.5. The $SiN_{4/3}$ component is about 25%. The uncertainty relates to the Eu doping content, which is usually introduced by means of $Eu_2O_3$. A mass spectroscopy study of the annealed charge stoichiometry $Ba_3Si_7O_{12}N_{3.3}$ (N:O=1: 3.6) confirmed the increased nitrogen content relative to the stoichiometry $Ba_3Si_6O_{12}N_2$ (N:O=1:6). The compounds in FIG. 21 are to be understood as phosphors with 2% Eu for Ba, i.e. for example M=($Ba_{0.99}Eu_{0.02}$) as the cation M in $M_3Si_7O_{12}N_{3.3}$.

Tab. 6a represents characteristics of the structure for various phosphors with different charge stoichiometries, which predominantly lie in the $SiN_{4/3}$ component range of from 20 to 30%. The doping content is 2 mol % Eu. The lattice constants a and c as well as the heterogeneous phase component are specified.

Tab. 6b shows, for various exemplary embodiments, the weigh-in stoichiometry, the efficiencies, the color locus components x and y, the dominant wavelength and the relative quantum efficiency Q.E. in percent, and specifically for an excitation wavelength of 400 nm. The doping content is 2 mol % Eu.

TABLE 6a

| Sample | a (in Å) | c (in Å) | Charge stoichiometry | Heterogeneous phase component (%) |
|---|---|---|---|---|
| BP 376/07 | 7.514 | 6.479 | $Ba_3Si_7O_{11}N_4$ | 21% $BaSi_2O_2N_2$ <3% $BaSi_2O_5$ |
| BP 377/07 | 7.510 | 6.478 | $Ba_3Si_7O_{13}N_{2.67}$ | — |
| BP 378/07 | 7.509 | 6.480 | $Ba_3Si_7O_{14}N_2$ | 29% $BaSi_2O_5$ |
| BP 379/07 | 7.510 | 6.476 | $Ba_3Si_7O_{12}N_{3.33}$ | — |
| BP 380/07 | 7.513 | 6.482 | $Ba_{2.5}Si_{7.5}O_{12.5}N_{3.33}$ | — |
| BP 381/07 | 7.513 | 6.478 | $Ba_{2.5}Si_{7.5}O_{13.5}N_{2.67}$ | <3% $BaSi_2O_5$ |
| BP 382/07 | 7.512 | 6.481 | $Ba_{2.5}Si_{7.5}O_{11.5}N_4$ | — |

TABLE 6b

| Sample BP ---/07 | Charge stoichiometry | x | y | $\lambda_{dom}$ (nm) | Rel. Q.E. (%) |
|---|---|---|---|---|---|
| 174 | $Ba_3Si_6O_{12}N_2$ | 0.258 | 0.591 | 537 | 95 |
| 376 | $Ba_3Si_7O_{11}N_4$ | 0.250 | 0.616 | 536 | 58 |
| 377 | $Ba_3Si_7O_{13}N_{2.67}$ | 0.252 | 0.630 | 538 | 98 |
| 378 | $Ba_3Si_7O_{14}N_2$ | — | — | — | — |
| 379 | $Ba_3Si_7O_{12}N_{3.33}$ | 0.252 | 0.626 | 538 | 100 |
| 380 | $Ba_{2.5}Si_{7.5}O_{12.5}N_{3.33}$ | 0.252 | 0.625 | 538 | 75 |
| 381 | $Ba_{2.5}Si_{7.5}O_{13.5}N_{2.67}$ | — | — | — | — |
| 382 | $Ba_{2.5}Si_{7.5}O_{11.5}N_4$ | 0.250 | 0.623 | 537 | 78 |

TABLE 3

| Sample BP---/07 | Weigh-in stoichiometry | Phase composition according to XRD | x | y | $\lambda_{dom}$ (nm) | Rel. Q.E. (%) |
|---|---|---|---|---|---|---|
| 121 | $Ba_4Si_5O_8N_2$ | — | 0.259 | 0.623 | 539 | 61 |
| 122 | $Ba_1Si_5O_{4.4}N_{4.4}$ | — | 0.248 | 0.607 | 535 | 55 |
| 123 | $Ba_{1.3}Si_1O_3N_{0.2}$ | — | 0.167 | 0.555 | 510 | 84 |
| 124 | $Ba_{1.3}Si_{1.45}O_{3.2}N_{0.66}$ | — | 0.271 | 0.511 | 532 | 6 |
| 126 | $Ba_1Si_9O_3N_{10.7}$ | New phase, $Si_3N_4$ | — | — | — | — |
| 127 | $Ba_1Si_9O_5N_{9.3}$ | New phase, $Si_3N_4$ | 0.244 | 0.586 | 532 | 33 |
| 128 | $Ba_1Si_4O_2N_{4.65}$ | $Ba_2SiO_4$, $Si_3N_4$ | 0.170 | 0.517 | 507 | 31 |

TABLE 3-continued

| Sample BP---/ 07 | Weigh-in stoichiometry | Phase composition according to XRD | x | y | $\lambda_{dom}$ (nm) | Rel. Q.E. (%) |
|---|---|---|---|---|---|---|
| 129 | $Ba_1Si_9O_7N_8$ | New phase, $Si_3N_4$ | 0.241 | 0.595 | 532 | 25 |
| 130 | $Ba_1Si_4O_3N_4$ | New phase, $Si_3N_4$ | — | — | — | — |
| 131 | $Ba_1Si_{2.3}O_{1.67}N_{2.67}$ | $Ba_2SiO_4$, $Si_3N_4$ | — | — | — | — |
| 132 | $Ba_1Si_9O_9N_{6.7}$ | New phase, $Si_3N_4$ | 0.245 | 0.599 | 534 | 30 |
| 133 | $Ba_1Si_4O_4N_{3.35}$ | New phase | 0.253 | 0.612 | 537 | 66 |
| 134 | $Ba_1Si_{2.3}O_{2.3}N_{2.22}$ | ? | 0.182 | 0.505 | 507 | 16 |
| 135 | $Ba_1Si_{1.5}O_{1.5}N_{1.68}$ | $Ba_2SiO_4$, $Si_3N_4$ | — | — | — | — |
| 136 | $Ba_1Si_9O_{11}N_{5.3}$ | New phase, $Si_3N_4$, $SiO_2$ | 0.247 | 0.602 | 534 | 33 |
| 137 | $Ba_1Si_4O_5N_{2.65}$ | New phase | 0.250 | 0.613 | 536 | 70 |
| 138 | $Ba_1Si_{2.3}O_3N_{1.77}$ | ?, $BaSiO_3$ | — | — | — | — |
| 139 | $Ba_2Si_3O_4N_{2.65}$ | $Ba_2SiO_4$ | — | — | — | — |
| 140 | $Ba_1Si_1O_{1.4}N_{1.06}$ | $Ba_2SiO_4$ | — | — | — | — |
| 141 | $Ba_1Si_9O_{13}N_4$ | ?, $SiO_2$ | 0.254 | 0.590 | 535 | 30 |
| 142 | $Ba_1Si_4O_6N_2$ | New phase, $BaSi_2O_5$ | 0.256 | 0.618 | 538 | 55 |
| 143 | $Ba_1Si_{2.3}O_{3.67}N_{1.33}$ | New phase, ? | 0.252 | 0.621 | 537 | 50 |
| 144 | $Ba_2Si_3O_5N_2$ | ?, $BaSiO_3$ | — | — | — | — |
| 145 | $Ba_5Si_5O_9N_4$ | $Ba_2SiO_4$ | — | — | — | — |
| 146 | $Ba_1Si_{0.67}O_{1.3}N_{0.67}$ | $Ba_2SiO_4$ | 0.174 | 0.545 | 510 | 63 |
| 147 | $Ba_1Si_9O_{15}N_{2.67}$ | New phase, $SiO_2$ | 0.255 | 0.602 | 537 | 58 |
| 148 | $Ba_2Si_8O_{14}N_{2.67}$ | ? | 0.264 | 0.623 | 540 | 67 |
| 149 | $Ba_1Si_{2.3}O_{4.3}N_{0.9}$ | New phase | 0.255 | 0.622 | 538 | 100 |
| 150 | $Ba_1Si_{1.5}O_3N_{0.668}$ | $BaSiO_3$ | — | — | — | — |
| 151 | $Ba_1Si_1O_{2.2}N_{0.534}$ | $Ba_2SiO_4$, $SiO_2$ | 0.167 | 0.545 | 510 | 70 |
| 152 | $Ba_1Si_{0.67}O_{1.67}N_{0.445}$ | $Ba_2SiO_4$ | — | — | — | — |
| 153 | $Ba_1Si_{0.43}O_{1.3}N_{0.38}$ | $Ba_2SiO_4$ | — | — | — | — |
| 154 | $Ba_1Si_9O_{17}N_{1.3}$ | $SiO_2$, $BaSi_2O_5$ | 0.274 | 0.586 | 541 | 39 |
| 155 | $Ba_1Si_4O_8N_{0.65}$ | $SiO_2$, $BaSi_2O_5$ | — | — | — | — |
| 156 | $Ba_1Si_{2.3}O_5N_{0.43}$ | $BaO$ (?), $BaSi_2O_5$ | 0.262 | 0.616 | 540 | 92 |
| 157 | $Ba_2Si_3O_7N_{0.65}$ | New phase, $BaSi_2O_5$ | 0.282 | 0.567 | 542 | 42 |
| 158 | $Ba_1Si_1O_{2.6}N_{0.26}$ | $Ba_2SiO_4$, $SiO_2$ | 0.180 | 0.551 | 512 | 25 |
| 159 | $Ba_1Si_{0.67}O_{2.8}N_{0.216}$ | $Ba_2SiO_4$ | 0.163 | 0.547 | 509 | 108 |
| 160 | $Ba_1Si_{0.43}O_{1.57}N_{0.19}$ | $Ba_2SiO_4$, $Ba_3SiO_5$ | 0.410 | 0.501 | 569 | 86 |
| 161 | $Ba_1Si_{0.25}O_{1.25}N_{0.163}$ | $Ba_3SiO_5$ | 0.517 | 0.465 | 582 | 94 |
| 168 | $Ba_3Si_7O_{14}N_2$ | New phase, $BaSi_2O_5$ | 0.260 | 0.621 | 539 | 95 |
| 169 | $Ba_{0.7}Si_{1.3}O_{2.7}N_{0.4}$ | New phase, $SiO_2$ | 0.260 | 0.585 | 537 | 77 |
| 170 | $Ba_{0.7}Si_{1.3}O_{2.5}N_{0.524}$ | New phase $SiO_2$ | 0.258 | 0.613 | 538 | 44 |
| 171 | $Ba_3Si_7O_{12.5}N_{3.3}$ | New phase, $BaSi_2O_5$ | 0.254 | 0.621 | 538 | 100 |
| 172 | $Ba_1Si_3O_5N_{1.33}$ | New phase, $BaSi_2O_5$ | 0.260 | 0.619 | 539 | 75 |
| 173 | $Ba_1Si_3O_{5.4}N_{1.068}$ | New phase, $BaSi_2O_5$ | 0.262 | 0.622 | 540 | 73 |
| 174 | $Ba_3Si_6O_{12}N_2$ | New phase, $BaSi_2O_5$ | 0.258 | 0.591 | 537 | 100 |
| 175 | $Ba_2Si_5O_9N_2$ | New phase | 0.255 | 0.623 | 536 | 100 |
| 415 | $Ba_3Si_7O_{12.5}N_{3.3}$ | New phase | 0.252 | 0.629 | 538 | 116 |
| 418 | $Ba_3Si_7O_{12.5}N_{3.3}$ | New phase | 0.252 | 0.629 | 538 | 113 |
| 416 | $Ba_3Si_6O_{12}N_2$ | New phase, $BaSi_2O_5$ | 0.254 | 0.604 | 537 | 112 |
| 419 | $Ba_3Si_6O_{12}N_2$ | New phase, $BaSi_2O_5$ | 0.252 | 0.593 | 536 | 107 |

TABLE 4a

| Sample BP---/ 07 | Weigh-in stoichiometry | Activator conc. (mol %) | Exc (nm) | x | y | $\lambda_{dom}$ (nm) | Rel. Q.E. (%) | Rel. Brightness (%) |
|---|---|---|---|---|---|---|---|---|
| 230 | $Ba_1Si_{2.3}O_{4.3}N_{0.9}$ | 2 | 400 | 0.254 | 0.624 | 538 | 81 | 54 |
| 230 a | $Ba_1Si_{2.3}O_{4.3}N_{0.9}$ | 2 | 400 | 0.254 | 0.630 | 538 | 84 | 76 |
| 231 | $Ba_3Si_6O_{12}N_2$ | 2 | 400 | 0.253 | 0.583 | 534 | 80 | 53 |
| 231 a | $Ba_3Si_6O_{12}N_2$ | 2 | 400 | 0.250 | 0.592 | 534 | 81 | 63 |
| 232 | $Ba_2Si_5O_9N_2$ | 2 | 400 | 0.255 | 0.625 | 538 | 81 | 56 |
| 232 a | $Ba_2Si_5O_9N_2$ | 2 | 400 | 0.252 | 0.630 | 538 | 81 | 76 |
| 415 | $Ba_3Si_7O_{12}N_{3.3}$ | 2 | 400 | 0.252 | 0.629 | 538 | 97 | 61 |
| 233 | $Ba_2Si_5O_9N_2$ | 4 | 400 | 0.268 | 0.629 | 542 | 86 | 74 |
| 233 a | $Ba_2Si_5O_9N_2$ | 4 | 400 | 0.265 | 0.634 | 541 | 80 | 89 |
| 236 | $Ba_2Si_5O_9N_2$ | 5 | 400 | 0.269 | 0.632 | 542 | 79 | 79 |
| 237 | $Ba_2Si_5O_9N_2$ | 10 | 400 | 0.296 | 0.632 | 548 | 63 | 75 |
| 240 | $Ba_3Si_6O_{12}N_2$ | 5 | 400 | 0.269 | 0.602 | 541 | 81 | 72 |
| 241 | $Ba_3Si_6O_{12}N_2$ | 10 | 400 | 0.296 | 0.619 | 548 | 65 | 76 |
| 244 | $Ba_1Si_{2.3}O_{4.3}N_{0.9}$ | 5 | 400 | 0.269 | 0.634 | 542 | 86 | 86 |
| 245 | $Ba_1Si_{2.3}O_{4.3}N_{0.9}$ | 10 | 400 | 0.296 | 0.633 | 548 | 69 | 85 |
| 498 | $Ba_3Si_7O_{12}N_{3.3}$ | 5 | 400 | 0.272 | 0.633 | 543 | 100 | 82 |
| 499 | $Ba_3Si_7O_{12}N_{3.3}$ | 10 | 400 | 0.302 | 0.629 | 549 | 92 | 100 |

TABLE 4b

| Sample BP---/07 | Weigh-in stoichiometry | Activator conc. (mol %) | Exc (nm) | x | y | $\lambda_{dom}$ (nm) | Rel. Q.E. (%) | Rel. Brightness (%) |
|---|---|---|---|---|---|---|---|---|
| 230 | $Ba_1Si_{2.3}O_{4.3}N_{0.9}$ | 2 | 460 | 0.259 | 0.630 | 540 | 78 | 37 |
| 230 a | $Ba_1Si_{2.3}O_{4.3}N_{0.9}$ | 2 | 460 | 0.259 | 0.636 | 540 | 86 | 63 |
| 231 | $Ba_3Si_6O_{12}N_2$ | 2 | 460 | 0.256 | 0.628 | 539 | 81 | 34 |
| 231 a | $Ba_3Si_6O_{12}N_2$ | 2 | 460 | 0.257 | 0.633 | 539 | 86 | 45 |
| 232 | $Ba_2Si_5O_9N_2$ | 2 | 460 | 0.260 | 0.629 | 540 | 75 | 39 |
| 232 a | $Ba_2Si_5O_9N_2$ | 2 | 460 | 0.256 | 0.363 | 539 | 81 | 63 |
| 233 | $Ba_2Si_5O_9N_2$ | 4 | 460 | 0.273 | 0.633 | 543 | 85 | 58 |
| 233 a | $Ba_2Si_5O_9N_2$ | 4 | 460 | 0.269 | 0.639 | 543 | 85 | 87 |
| 236 | $Ba_2Si_5O_9N_2$ | 5 | 460 | 0.274 | 0.636 | 544 | 84 | 74 |
| 237 | $Ba_2Si_5O_9N_2$ | 10 | 460 | 0.300 | 0.633 | 549 | 69 | 86 |
| 240 | $Ba_3Si_6O_{12}N_2$ | 5 | 460 | 0.273 | 0.634 | 543 | 96 | 62 |
| 241 | $Ba_3Si_6O_{12}N_2$ | 10 | 460 | 0.300 | 0.633 | 549 | 88 | 94 |
| 244 | $Ba_1Si_{2.3}O_{4.3}N_{0.9}$ | 5 | 460 | 0.274 | 0.638 | 544 | 91 | 81 |
| 245 | $Ba_1Si_{2.3}O_{4.3}N_{0.9}$ | 10 | 460 | 0.301 | 0.635 | 549 | 78 | 100 |
| 498 | $Ba_3Si_7O_{12}N_{3.3}$ | 5 | 460 | 0.272 | 0.633 | 543 | 100 | 75 |
| 499 | $Ba_3Si_7O_{12}N_{3.3}$ | 10 | 460 | 0.302 | 0.629 | 549 | 96 | 94 |

TABLE 5

| Sample Number | Charge stoichiometry | $\lambda_{Exc}$ (nm) | x | y |
|---|---|---|---|---|
| BP 234/07 | $(Ba_{0.99}Eu_{0.01})_2Si_5O_9N_2$ | 400 | 0.25 | 0.62 |
| BP 319/07 | $(Ba_{0.98}Eu_{0.01}Ce_{0.01})_2Si_5O_9N_2$ | 400 | 0.25 | 0.62 |
| BP 319/07 | $(Ba_{0.98}Eu_{0.01}Ce_{0.01})_2Si_5O_9N_2$ | 370 | 0.25 | 0.62 |
| BP 320/07 | $(Ba_{0.98}Eu_{0.02})_2Si_5O_9N_2$ | 370 | 0.18 | 0.15 |
| BP 320/07 | $(Ba_{0.98}Eu_{0.02})_2Si_5O_9N_2$ | 338 | 0.18 | 0.12 |
| BP 320/07 | $(Ba_{0.98}Eu_{0.02})_2Si_5O_9N_2$ | 290 | 0.18 | 0.12 |
| BP 322/07 | $(Ba_{0.95}Tb_{0.05})_2Si_5O_9N_2$ | 254 | 0.21 | 0.61 |
| BP 323/07 | $Ba_{0.98}Eu_{0.01}Mn_{0.01})_2Si_5O_9N_2$ | 400 | 0.25 | 0.62 |
| BP 323/07 | $Ba_{0.98}Eu_{0.01}Mn_{0.01})_2Si_5O_9N_2$ | 370 | 0.25 | 0.62 |

The invention claimed is:

1. A thermally stable phosphor made of the M-Si—O—N system, having a cation M and an activator D, M being represented by Ba or Sr alone or as a mixture and optionally also being combined with at least one other element from the group Ca, Mg, Zn, Cu, the phosphor being activated with Eu or Tb alone or as a mixture, optionally in codoping with Mn or Yb, the activator D partially replacing the cation M, and the phosphor emits green, wherein the phosphor is produced from the charge stoichiometry $MO—SiO_2—SiN_{4/3}$ with an increased oxygen content relative to the known phosphor $MSi_2O_2N_2$:D, where MO is an oxidic compound, and the phosphor has the stoichiometry $M_aSi_{b+3c}O_{a+2b}N_{4c}$, in which the ratio of b:c is from 4.8 to 9.0, wherein a is from 1 to 3.

2. The phosphor as claimed in claim 1, wherein the component MO was introduced by means of a compound $MCO_3$.

3. The phosphor as claimed in claim 2, wherein the $MCO_3:SiO_2$ ratio of the charge mixture is between 1:1.5 and 1:2, including the endpoint values.

4. The phosphor as claimed in claim 3, wherein the $SiN_{4/3}$ component of the charge mixture in the system $MCO_3—SiO_2—SiN_{4/3}$ is 15% to 55%.

5. The phosphor as claimed in claim 4, wherein the $SiN_{4/3}$ component is 20% to 55%.

6. The phosphor as claimed in claim 1, wherein the phosphor itself has the stoichiometry $M_{2.5}Si_6O_{11.5}N_2$, where M=Ba alone or predominantly at more than 50 mol %.

7. The phosphor as claimed in claim 1, wherein the phosphor essentially has the stoichiometry $M_aSi_{b+3c}O_{a+2b}N_{4c}$, where a:c=3.5 to 5.5.

8. The phosphor as claimed in claim 7, wherein b:c lies in the range of from 5 to 6 and at the same time a:c lies in the range of from 3.5 to 4.

9. A light source having a phosphor as claimed in claim 1.

10. The light source as claimed in claim 9, wherein the light source is an LED.

11. A method for producing a phosphor as claimed in claim 1, wherein the method comprises:
   a) homogenizing the substances $MCO_3$, $SiO_2$, $Si_3N_4$ and an oxide of D for 2 to 8 hours; wherein an $MCO_3:SiO_2$ ratio of between 1:1.5 and 1:2, including endpoint values, is maintained;
   b) first annealing of the charge mixture under reducing conditions, at a temperature of from 1200 to 1400° C., for 4 to 10 hours;
   c) optionally grinding the anneal cake;
   d) optionally second annealing under reducing conditions, at a temperature of from 850° C. to 1450° C.

12. The method as claimed in claim 11, wherein the $SiN_{4/3}$ component of the charge mixture in the preparation of the system $MCO_3—SiO_2—SiN_{4/3}$ is 15% to 55%.

13. The method as claimed in claim 12, wherein the $SiN_{4/3}$ component is at most 30%.

14. The method as claimed in claim 11, wherein a fluxing agent is used with a proportion of at most 5 wt % expressed in terms of the charge stoichiometry without a fluxing agent.

15. The phosphor as claimed in claim 5, wherein the $SiN_{4/3}$ component is at most 30%.

16. The method as claimed in claim 14, wherein the fluxing agent is a chloride or carbonate.

17. The method as claimed in claim 11, wherein said oxide of D is $Eu_2O_3$ alone or in combination with Yb oxide.

18. A thermally stable phosphor made of the M-Si—O—N system, having a cation M and an activator D, M being represented by Ba or Sr alone or as a mixture and optionally also being combined with at least one other element from the group Ca, Mg, Zn, Cu, the phosphor being activated with Eu or Tb alone or as a mixture, optionally in codoping with Mn or Yb, the activator D partially replacing the cation M, and the phosphor emits green, wherein the phosphor is produced from the charge stoichiometry $MO—SiO_2—SiN_{4/3}$ with an increased oxygen content relative to the known phosphor $MSi_2O_2N_2$:D, where MO is an oxidic compound, and the phosphor has the stoichiometry $M_aSi_{b+3c}O_{a+2b}N_{4c}$, in which the ratio of a:c is from 3.5 to 5.5, wherein b is from 1 to 5.5.

19. A thermally stable phosphor made of the M-Si—O—N system, having a cation M and an activator D, M being represented by Ba or Sr alone or as a mixture and optionally also being combined with at least one other element from the group Ca, Mg, Zn, Cu, the phosphor being activated with Eu or Tb alone or as a mixture, optionally in codoping with Mn or Yb, the activator D partially replacing the cation M, and the phosphor emits green, wherein the phosphor is produced from the charge stoichiometry $MO$—$SiO_2$—$SiN_{4/3}$ with an increased oxygen content relative to the known phosphor $MSi_2O_2N_2$:D, where MO is an oxidic compound, and the phosphor has the stoichiometry $M_aSi_{b+3c}O_{a+2b}N_{4c}$, in which the ratio of a:c is from 3.5 to 5.5, the ratio of b:c is from 4.8 to 9.0, and wherein c is from 0.131 to 2.675.

* * * * *